United States Patent
Tamaru et al.

[11] Patent Number: 6,103,566
[45] Date of Patent: Aug. 15, 2000

[54] METHOD FOR MANUFACTURING SEMICONDUCTOR INTEGRATED CIRCUIT DEVICE HAVING A TITANIUM ELECTRODE

[75] Inventors: Tsuyoshi Tamaru, Ome; Shinpei Iijima, Akishima; Natsuki Yokoyama, Mitaka; Masayuki Nakata, Kodaira, all of Japan

[73] Assignee: Hitachi, Ltd., Tokyo, Japan

[21] Appl. No.: 08/760,867

[22] Filed: Dec. 9, 1996

[30] Foreign Application Priority Data

Dec. 8, 1995 [JP] Japan .................... 7-320596

[51] Int. Cl.[7] .................... H01L 21/8242
[52] U.S. Cl. .................... 438/240; 438/683
[58] Field of Search .................... 438/238–240, 438/250–256, 381, 393–398, 648, 683

[56] References Cited

U.S. PATENT DOCUMENTS

| | | |
|---|---|---|
| 5,383,088 | 1/1995 | Chapple-Sokol et al. . |
| 5,438,012 | 8/1995 | Kamiyama . |
| 5,834,357 | 11/1998 | Kang .................... 438/396 |

FOREIGN PATENT DOCUMENTS

| | | |
|---|---|---|
| 0643395 | 3/1995 | European Pat. Off. . |
| A-1-222469 | 9/1989 | Japan . |
| A-6-232344 | 8/1994 | Japan . |
| A-7-66300 | 3/1995 | Japan . |
| A-7-66369 | 3/1995 | Japan . |

*Primary Examiner*—Jey Tsai
*Attorney, Agent, or Firm*—Antonelli, Terry, Stout & Kraus, LLP

[57] ABSTRACT

A dynamic random access memory or the like, in which in order to prevent the breakdown voltage deterioration of a capacitive element when a TiN film of an electrode material is deposited by the CVD method over a tantalum film constituting the capacitor insulating film of the capacitive element, a passivation film is formed in advance over the surface of the tantalum oxide film to prevent the tantalum oxide film from contacting a nitrogen-containing reducing gas, when the TiN film is deposited over the tantalum oxide film by the CVD method using a titanium-containing source gas and the nitrogen-containing reducing gas.

18 Claims, 38 Drawing Sheets

FIG. 38

TiN – CVD REACTION FORMULAS (1) MONOMETHYL HYDRAZINE REDUCTION $$2TiCl_4 + 2N_2H_3CH_3 \Rightarrow 4TiN + 8HCl + N_2 + 4CH_2Cl_2 + 2NH_3$$

(2) AMMONIA REDUCTION $$6TiCl_4 + 8NH_3 \Rightarrow 6TiN + 24HCl + N_2$$

(3) AMMONIA REDUCTION OF TDEAT $$Ti[N(C_2H_5)_2]_4 + NH_3 \Rightarrow TiN + H_xN(CH_3)_y$$

(4) AMMONIA REDUCTION OF TDAMT $$Ti[N(CH_3)_2]_4 + NH_3 \Rightarrow TiN + H_xN(CH_3)_y$$

METHOD FOR MANUFACTURING SEMICONDUCTOR INTEGRATED CIRCUIT DEVICE HAVING A TITANIUM ELECTRODE

BACKGROUND OF THE INVENTION

The present invention relates to a semiconductor integrated circuit device and a technique for manufacturing the same, and, more particularly, to a technique which is effective when applied to a semiconductor integrated circuit device having a memory cell wherein the capacitor insulating film of a capacitive element (capacitor) is made of a highly dielectric material.

In a large capacity DRAM (Dynamic Random Access Memory) of the type available in recent years, in order to compensate for the reduction in the accumulated charge of a capacitive element, resulting from the miniaturization of a memory cell, there has been adopted a stacked capacitor structure in which the capacitive element is arranged over a memory cell selecting MISFET. Moreover, the surface area of the capacitive element is enlarged by forming its lower electrode (storage electrode) into a fin shape or a cylindrical shape, and the capacitor insulating film is made of a material having a high dielectric constant. Especially, a tantalum oxide ($Ta_2O_5$) representative of the one of highly dielectric materials has a dielectric constant as high as 20 to 25 and has a high matching characteristic with the DRAM process of the prior art, so that the application of the DRAM to the capacitive element is being more widely employed.

When the capacitor insulating film of the capacitive element is made of tantalum oxide, a material for preventing the deterioration of the film quality of the tantalum oxide has to be selected as the material of the upper electrode (or plate electrode) to be formed over the capacitor insulating film. This upper electrode material may be suitably exemplified by a refractory metal, such as W (tungsten), Pt (platinum) or Mo (molybdenum) or its nitride, such as TiN (titanium nitride).

According to "Jpn. J. Appl. Phys. Vol. 33 (1994) Pt. 1, No. 3A", having investigated the influences of the leakage current upon the tantalum oxide film before and after the annealing step of the electrode material, it has been reported, based on experimental results, that the electric characteristics of the tantalum oxide film are determined by the work function of the electrode material and the stability of the interface between the upper electrode and the tantalum oxide, and that the most appropriate material is TiN for the annealing at a low temperature (about 400° C.) and Mo or MoN (molybdenum nitride) for the annealing at a high temperature (about 800° C.).

Since the lower electrode of the capacitive element of the DRAM has a complicated surface shape, as described above, the CVD (Chemical Vapor Deposition) method having an excellent step coverage has to be used rather than the sputtering method when a tantalum oxide film is deposited over the lower electrode. However, the tantalum oxide film deposited by the CVD method has to be annealed, after being formed, at a temperature as high as about 700 to 800° C. because a desired dielectric constant cannot achieved as it is. With this annealing, however, an oxide film is formed at the interface with the lower electrode material (the polycrystalline silicon film) of the substrate to lower the effective dielectric constant of the capacitor insulating film. Another problem is that the oxygen in the tantalum oxide film becomes scarce to resulting in a lower breakdown voltage of the film, thereby to increase the leakage current.

Japanese Patent Laid-Open No. 3548/1986 has disclosed a technique for correcting this defect due to the oxygen vacancy in the tantalum oxide film deposited over a semiconductor substrate using the CVD method, thereby to improve the insulating breakdown voltage of the film by annealing the surface of the film in the atmosphere of dry oxygen.

"International Conference on Solidstate Devices and Materials 1992" (pp. 521 to 523) has disclosed a technique for preventing an oxide film from being formed on the surface of a polycrystalline silicon film constituting a lower electrode of a capacitive element, when a tantalum oxide film is to be deposited, by annealing the polycrystalline silicon film in the atmosphere of $NH_3$ (ammonia) to form a nitride film on the surface of the polycrystalline silicon film.

In the DRAM disclosed in Japanese Patent Laid-Open No. 66300/1995, the capacitor insulating film of the capacitive element is made of tantalum oxide, strontium titanate ($SrTiO_3$) or barium titanate deposited by the CVD method, and the upper electrode is made of W, Pt or TiN deposited by the CVD method or the sputtering method. Moreover, the lower electrode is made of a material such as zinc oxide (ZnO) or tin oxide ($SnO_2$) exhibiting a high resistance to oxidation, so that any oxidized film is prevented from being formed at the interface with the lower electrode at the time of annealing the capacitor insulating film.

In the DRAM disclosed in Japanese Patent Laid-Open No. 66369/1995, the capacitor insulating film of a capacitive element is made of tantalum oxide deposited by the CVD method. By annealing the formed film at a lower temperature (lower than about 600° C.) than that for crystallization, thereby to hold the film in an amorphous structure, moreover, the occurrence of a grain boundary, cracking or a micro defect which might establish paths for the leakage current is suppressed so as to improve the leakage current characteristics.

In the DRAM disclosed in Japanese Patent Laid-Open No. 222469/1989, the capacitor insulating film of a capacitive element is made of tantalum oxide or hafnium oxide ($HfO_2$) deposited by the CVD method, and a barrier film of TiN is formed between the tantalum oxide (or hafnium oxide) and the electrodes (the upper electrode and the lower electrode) of polycrystalline silicon thereby to prevent a reaction between the silicon and the tantalum oxide.

In the DRAM disclosed in Japanese Patent Laid-Open No. 232344/1994, the capacitor insulating film of a capacitive element is made of tantalum oxide or hafnium oxide deposited by the CVD method, and the upper electrode is made of TiN. By forming a nonmetal buffering film of polycrystalline silicon over the TiN, the capacitive element is prevented from deteriorating when a BPSG (Boron-doped Phospho Silicate Glass) film deposited over the capacitive element is subjected to hot reflow (at about 850° C. for 30 minutes).

SUMMARY OF THE INVENTION

We deposited a conductive film of polycrystalline silicon over a semiconductor substrate and then a tantalum oxide film over that, and deposited a TiN film over the tantalum oxide film by the CVD method using a titanium containing source gas, such as $TiCl_4$ (titanium tetrachloride) TDMAT (Tetraxy Di-Methyl Amino Titanium) or TDEAT (Tetraxy Di-Ethyl Amino Titanium) and a nitrogen-containing reducing gas, such as $NH_3$ or MMH (Mono-Methyl Hydrazine). Then, these films were patterned to form a capacitive element and the breakdown voltage of the capacitor insulating film (the tantalum oxide film) was examined and a phenomenon that the breakdown voltage was deteriorated and the leakage current increased was observed.

The cause of this phenomenon has not been sufficiently clarified yet, but we consider that the cause is that if the surface of the tantalum oxide film is hot and contacts the reducing gas, the oxygen (0) atoms in the film partially react with the reducing gas and are released, and the dangling bonds of Ta or 0 increase in the film.

An object of the present invention is to provide a technique for preventing the drawback that the breakdown voltage of a capacitor insulating film made of a highly dielectric material, such as tantalum oxide, is deteriorated when an upper electrode material is deposited over the capacitor insulating film by the CVD method using a reactive gas containing a reducing gas.

The foregoing and other objects and novel features of the present invention will become apparent from the description of the present invention and the accompanying drawings.

A representative one of the inventions disclosed herein will be briefly summarized in the following.

According to the present invention, there is provided a semiconductor integrated circuit device comprising a capacitive element including: a lower electrode; a capacitor insulating film made of one or more films including a highly dielectric film formed over the lower electrode; and an upper electrode made of one or more films including a titanium nitride film formed over the capacitor insulating film, wherein the upper electrode of the capacitive element is formed over the highly dielectric film through a passivation film formed by a low temperature CVD method under the condition that no reducing gas is employed.

In a semiconductor integrated circuit device of the present invention, the capacitor insulating film includes a tantalum oxide film.

In a semiconductor integrated circuit device of the present invention, the capacitive element is arranged over a memory cell selecting MISFET constituting a memory cell of a DRAM.

According to the present invention, there is provided a method of manufacturing a semiconductor integrated circuit device, comprising:

(a) the step of forming a first conductor film constituting a lower electrode of a capacitive element, over the principal face of a semiconductor substrate;

(b) the step of forming a capacitor insulating film made of one or more films, including a highly dielectric film, over the first conductive film;

(c) the step of forming a passivation film over the capacitor insulating film by a low temperature CVD method under the condition that no reducing gas is employed; and (d) the step of forming a second conductive film made of one or more films including a titanium nitride film forming an upper electrode of the capacitive element, over the passivation film.

In a method of manufacturing a semiconductor integrated circuit device of the present invention, the capacitor insulating film includes a tantalum oxide film.

In a method of manufacturing a semiconductor integrated circuit device of the present invention, the passivation film includes an amorphous titanium film or a polycrystalline titanium film.

In a method of manufacturing a semiconductor integrated circuit device of the present invention, the capacitive element is arranged over a memory cell selecting MISFET constituting a memory cell of a DRAM.

A method of manufacturing a semiconductor integrated circuit device of the present invention further comprises the step of patterning at least a portion of the lower electrode of the capacitive element into a fin shape or a cylindrical shape.

According to the present invention, there is provided a method of manufacturing a semiconductor integrated circuit device, comprising:

(a) the step of forming a MISFET over the principal face of a semiconductor substrate;

(b) the step of forming a first conductive film made of one or more films, over the MISFET;

(c) the step of forming a lower electrode of a capacitive element by patterning at least a portion of the first conductive film into a fin shape or a cylindrical shape;

(d) the step of forming a capacitor insulating film made of one or more films including a highly dielectric film, over the lower electrode;

(e) the step of forming a passivation film over the capacitor insulating film by a low temperature CVD method under the condition that a titanium-containing source gas is employed, but no nitrogen containing reducing gas is employed;

(f) the step of forming a second conductive film made of one or more films including a titanium nitride film, over the passivation film by a low temperature CVD method under the condition that a titanium-containing source gas and a nitrogen-containing reducing gas are employed; and (g) the step of forming an upper electrode of the capacitive element by patterning the second conductive film, the passivation film and the capacitor insulating film.

In a method of manufacturing a semiconductor integrated circuit device of the present invention, the passivation film and the second conductive film are continuously formed by introducing the titanium-containing source gas and then the nitrogen-containing reducing gas into the chamber of a CVD apparatus.

In a method of manufacturing a semiconductor integrated circuit device of the present invention, the capacitor insulating film includes a tantalum oxide film.

In a method of manufacturing a semiconductor integrated circuit device of the present invention, the passivation film includes an amorphous titanium film or a polycrystalline titanium film.

In a method of manufacturing a semiconductor integrated circuit device of the present invention, the titanium-containing source gas contains tetrachloride titanium, tetraxydimethylamino titanium or tetraxydimethylamino titanium, or a mixture, thereof.

In a method of manufacturing a semiconductor integrated circuit device of the present invention, the nitrogen containing reducing gas contains ammonia or monomethyl hydrazine, or a mixture thereof.

BRIEF DESCRIPTION OF THE DRAWINGS

FIG. 38 is a diagram showing formulas expressing the reactions between titanium-containing source gases and nitrogen containing reducing gases;

DESCRIPTION OF THE PREFERRED EMBODIMENTS

Figure 1:
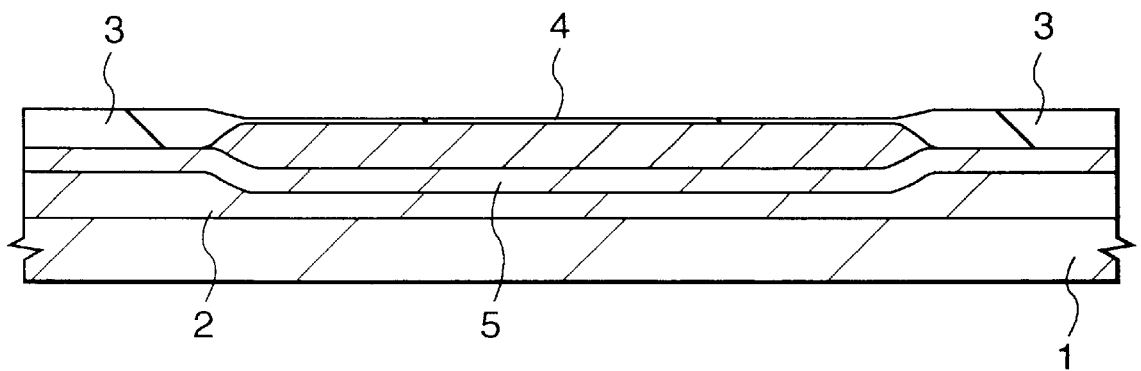
FIG. 1 is a sectional diagram of an essential portion of a semiconductor substrate, showing a step of a method of manufacturing a DRAM of one embodiment according to the present invention.

The present invention will be described in detail in the following in connection with various embodiments with reference to the accompanying drawings. Incidentally, throughout all the drawings for explaining the embodiments, parts and members having identical functions will be designated by common reference numerals, and their repeated description will be omitted.

Embodiment 1

The present embodiment is applied to a DRAM having memory cells of a capacitor-over-bit line (COB) structure in which bit lines are arranged over memory cell selecting MISFETs and data storing capacitive elements are arranged over the bit lines.

In order to form such a memory cell, first of all, the principal face of a semiconductor substrate 1 made of p-type monocrystalline silicon is doped with ions of a p-type impurity (boron) to form a p-type well 2, as shown in FIG. 1. After this, an element isolating field oxide film 3 and gate oxide film 4 are formed over the surface of the p-type well 2 by a well-known LOCOS method. Next, the p-type well 2, including the lower portion of the field oxide film 3, is doped with ions of a p-type impurity (boron) to form an element isolating p-type channel stopper layer 5.

Figure 2:
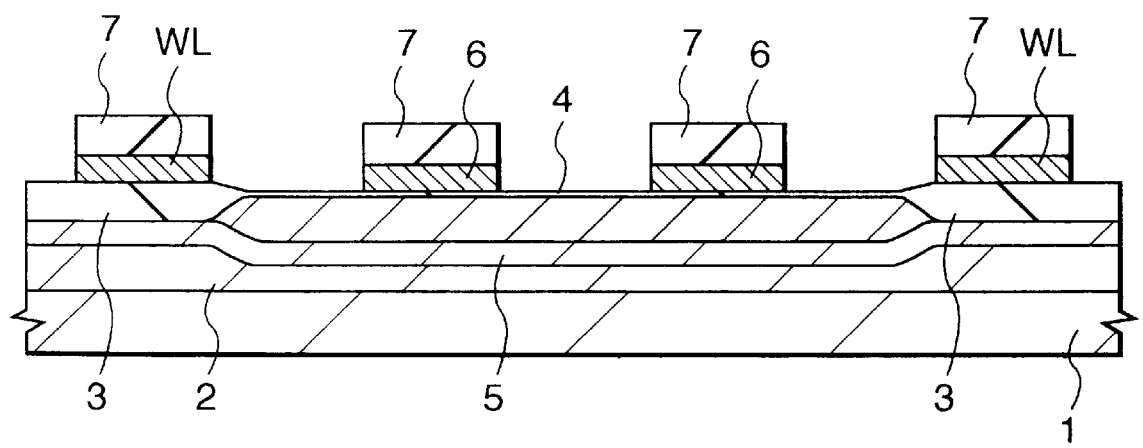
FIG. 2 is a sectional diagram of the essential portion of the semiconductor substrate, showing a step of the method of manufacturing the DRAM of the embodiment according to the present invention.

Next, gate electrodes 6 (and word lines WL to be formed integrally with the gate electrode 6) of the memory cell selecting MISFET are formed over the p-type well 2, as shown in FIG. 2. These gate electrodes 6 act as the word lines WL of the memory cell. The gate electrodes 6 are formed by depositing a polycrystalline silicon film (a polycide film comprising a polycrystalline silicon film and a refractory metal silicide film) and a silicon oxide film 7 over the p-type well 2 by a CVD method, and by subsequently patterning those films by the etching method using a photoresist as the mask.

Figure 3:
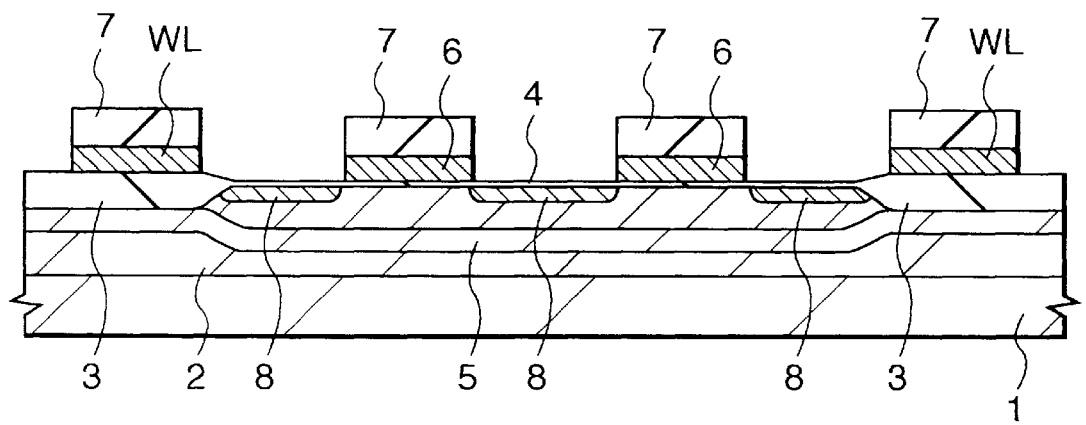
FIG. 3 is a sectional diagram of the essential portion of the semiconductor substrate, showing a step of the method of manufacturing the DRAM of the embodiment according to the present invention.
Figure 4:
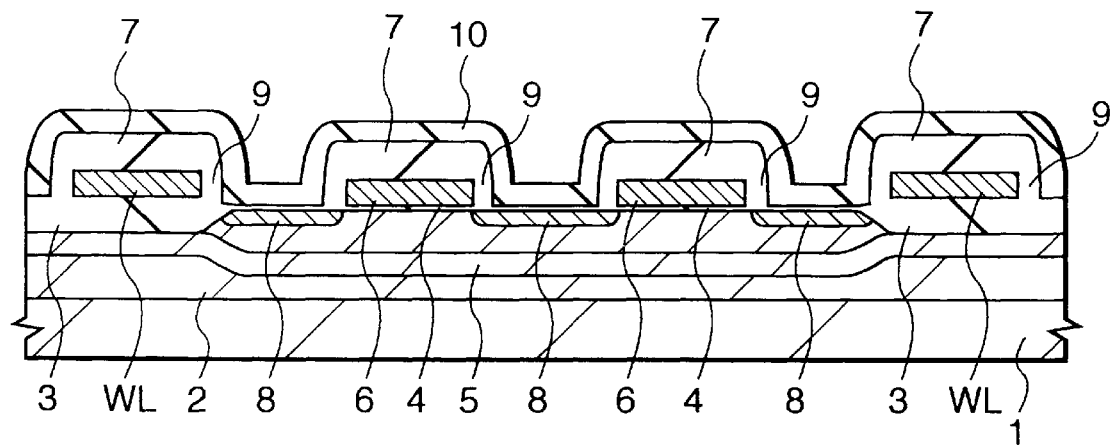
FIG. 4 is a sectional diagram of the essential portion of the semiconductor substrate, showing the method of manufacturing the DRAM of the embodiment according to the present invention.

Next, the p-type well 2 is doped with an n-type impurity (phosphor) to form n-type semiconductor regions 8 (the source region and the drain region) of a memory cell selecting MISFET, as shown in FIG. 3. Subsequently, side wall spacers 9 are formed on the side walls of the gate electrodes 6 (the word lines WL), as shown in FIG. 4, and a silicon oxide film 10 is then deposited by the CVD method. The side wall spacers 9 are formed by patterning the silicon oxide film, deposited by the CVD method, using the reactive ion etching method.

Figure 5:
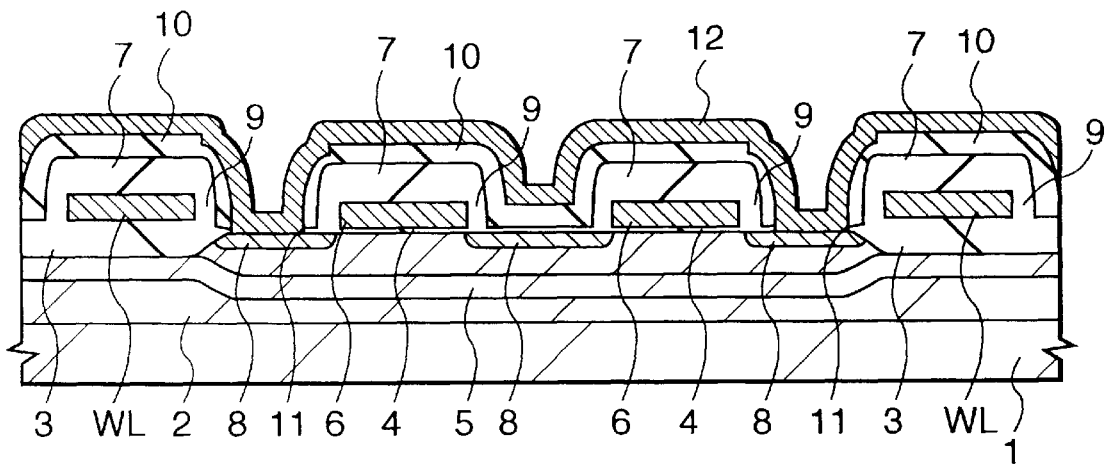
FIG. 5 is a sectional diagram of the essential portion of the semiconductor substrate, showing a step of the method of manufacturing the DRAM of the embodiment according to the present invention.
Figure 6:
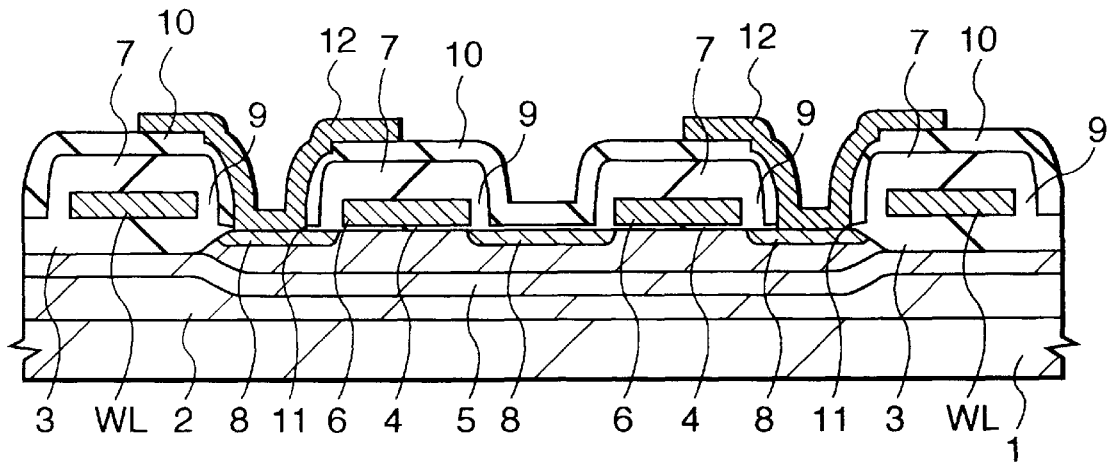
FIG. 6 is a sectional diagram of the essential portion of the semiconductor substrate, showing a step of the method of manufacturing the DRAM of the embodiment according to the present invention.

Next, the silicon oxide film 10 and the gate oxide film 4, located over one of the source and the drain regions (the n-type semiconductor region 8) of the memory cell selecting MISFET, are opened to form connection holes 11, as shown in FIG. 5. After this, an n-type polycrystalline silicon film 12 is deposited over the silicon oxide film 10 by the CVD method and is then patterned, as shown in FIG. 6.

Figure 7:
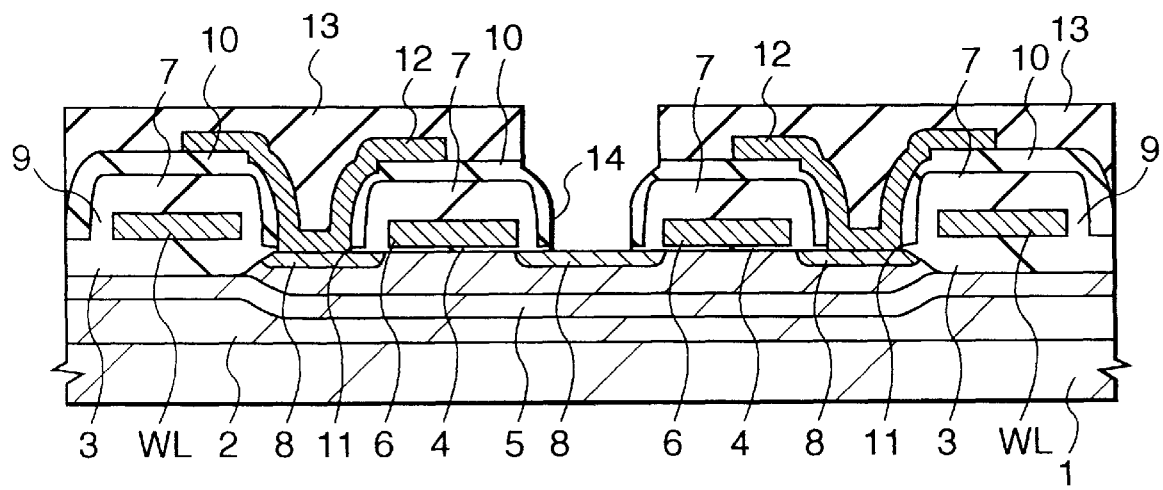
FIG. 7 is a sectional diagram of the essential portion of the semiconductor substrate, showing a step of the method of manufacturing the DRAM of the embodiment according to the present invention.

Next, a BPSG film 13, deposited by the CVD method, is subjected to reflow thereby to flatten its surface, as shown in FIG. 7. After this, the BPSG film 13, the silicon oxide film 10 and the gate oxide film 4, located over the other of the source and drain regions (the n-type semiconductor region 8) of the memory cell selecting MISFET, are opened to form a connection hole 14.

Figure 8:
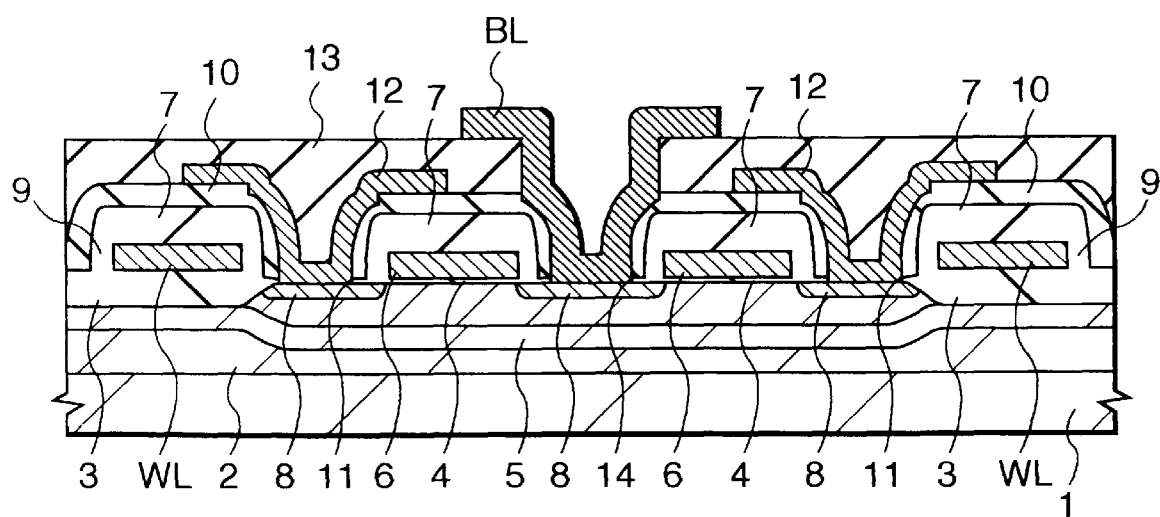
FIG. 8 is a sectional diagram of the essential portion of the semiconductor substrate, showing a step of the method of manufacturing the DRAM of the embodiment according to the present invention.

Next, the n-type polycrystalline silicon film, deposited over the BPSG film 13 by the CVD method, is patterned to form a bit line BL connected with the n-type semiconductor region 8 through the connection hole 14, as shown in FIG. 8. The bit line BL may be made of a multilayered film of a TiN film and a W film deposited by the sputtering method.

Figure 9:
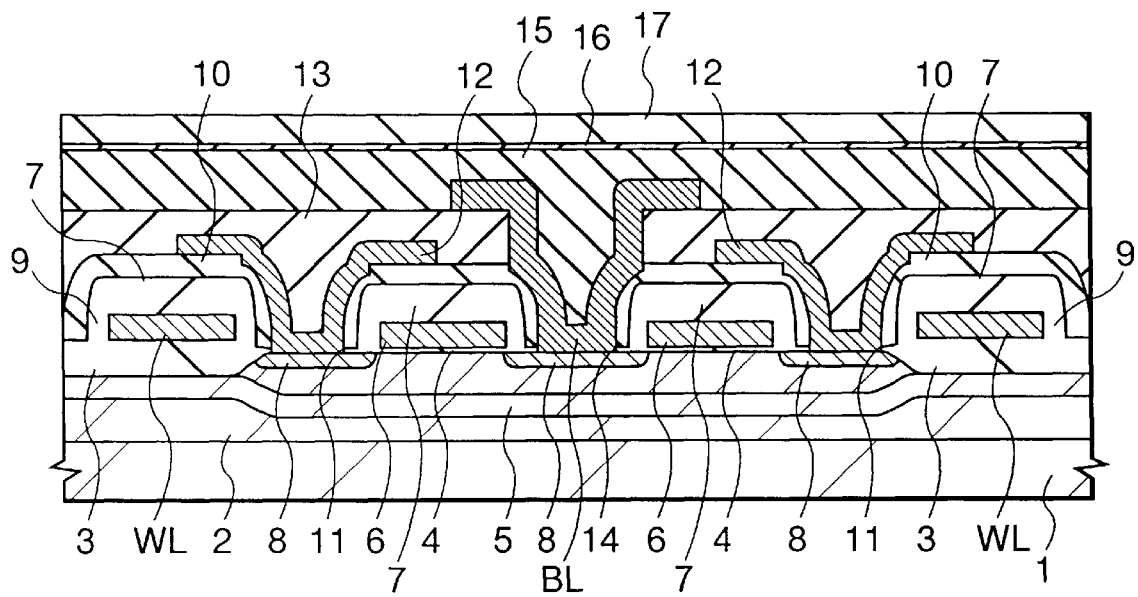
FIG. 9 is a sectional diagram of the essential portion of the semiconductor substrate, showing a step of the method of manufacturing the DRAM of the embodiment according to the present invention.
Figure 10:
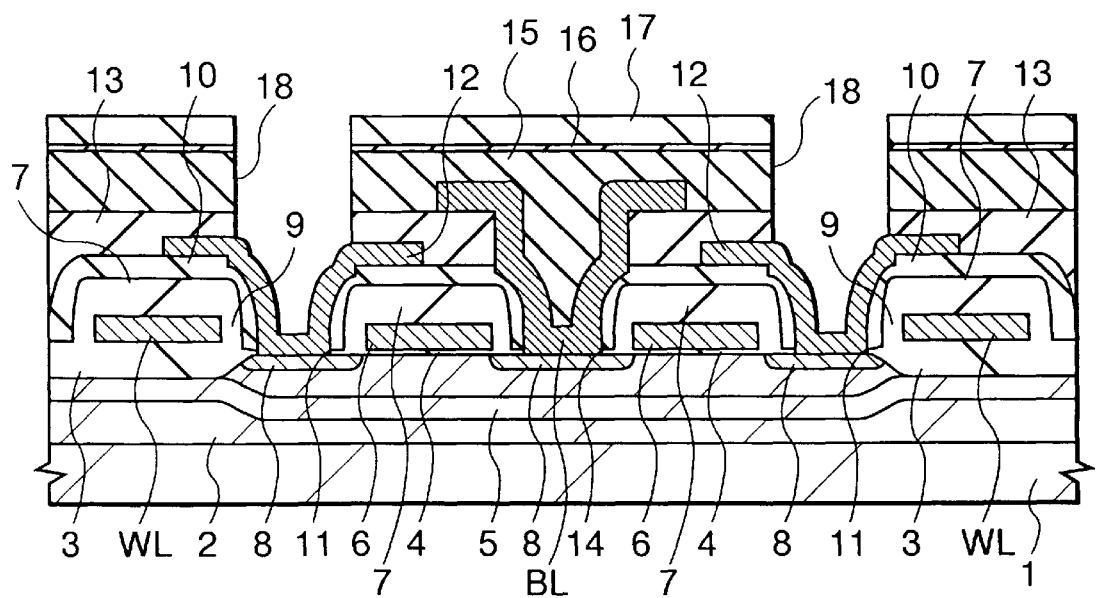
FIG. 10 is a sectional diagram of the essential portion of the semiconductor substrate, showing a step of the method of manufacturing the DRAM of the embodiment according to the present invention.

Next, a silicon oxide film 15, a silicon nitride film 16 and a silicon oxide film 17 are sequentially deposited over the BPSG film 13 by the CVD method, as shown in FIG. 9. After this, the silicon oxide film 17, the silicon nitride film 16 and the silicon oxide film 15, located over the n-type semiconductor region 8, are opened to form connection holes 18 reaching the polycrystalline silicon film 12, as shown in FIG. 10.

Figure 11:
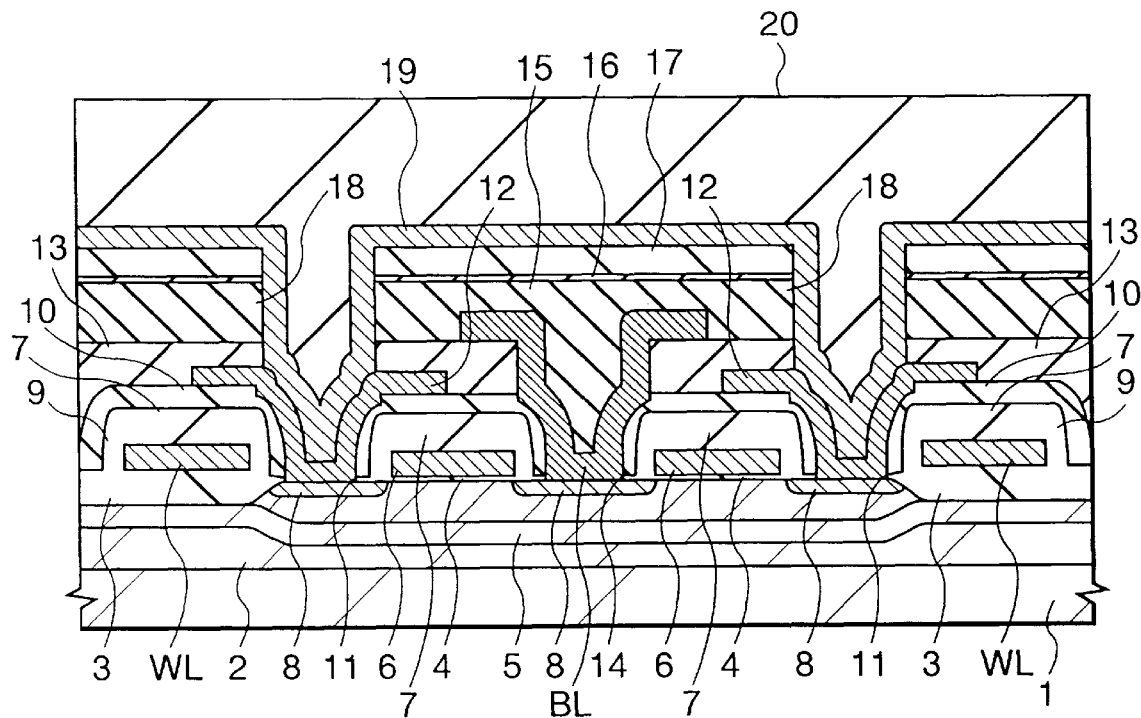
FIG. 11 is a sectional diagram of the essential portion of the semiconductor substrate, showing a step of the method of manufacturing the DRAM of the embodiment according to the present invention.
Figure 12:
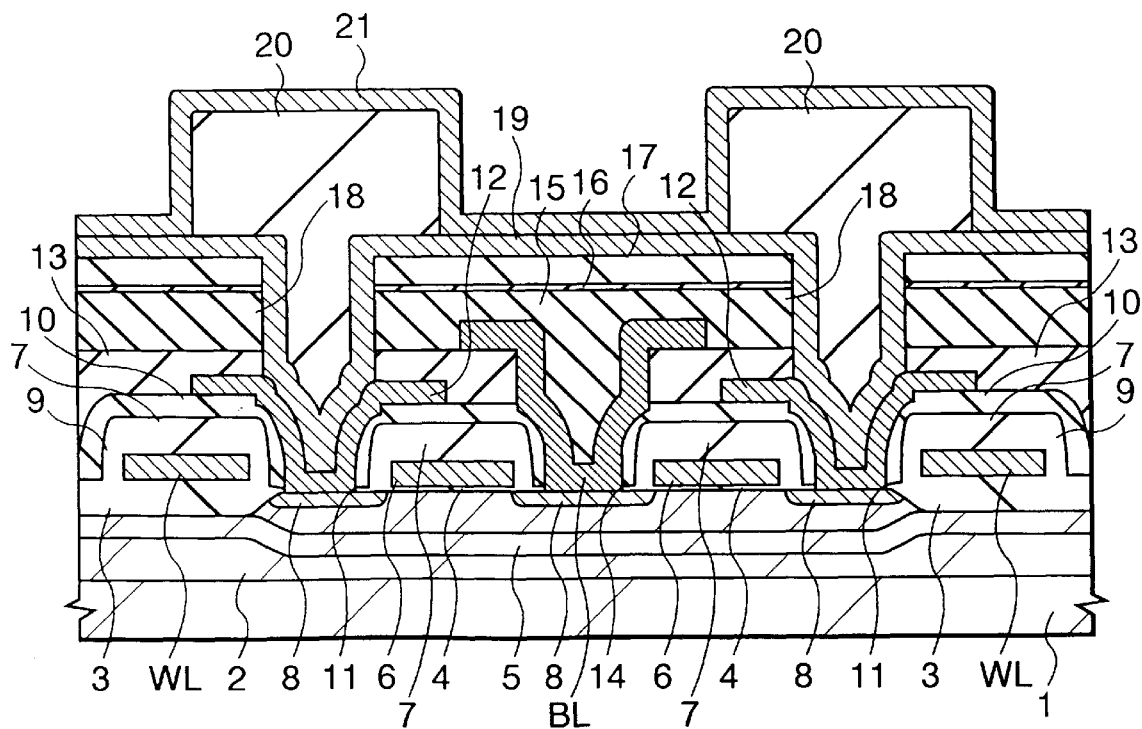
FIG. 12 is a sectional diagram of the essential portion of the semiconductor substrate, showing a step of the method of manufacturing the DRAM of the embodiment according to the present invention.

Next, an n-type polycrystalline silicon film 19 is deposited over the silicon oxide film 17 by the CVD method, as shown in FIG. 11, and a silicon oxide film 20 is then deposited over the polycrystalline silicon film 19 by the CVD method. Subsequently, the silicon oxide film 20 is cylindrically patterned, leaving the portions only in and over the connection holes 18, as shown in FIG. 12, and an n-type polycrystalline silicon film 21 is then deposited by the CVD method.

Figure 13:
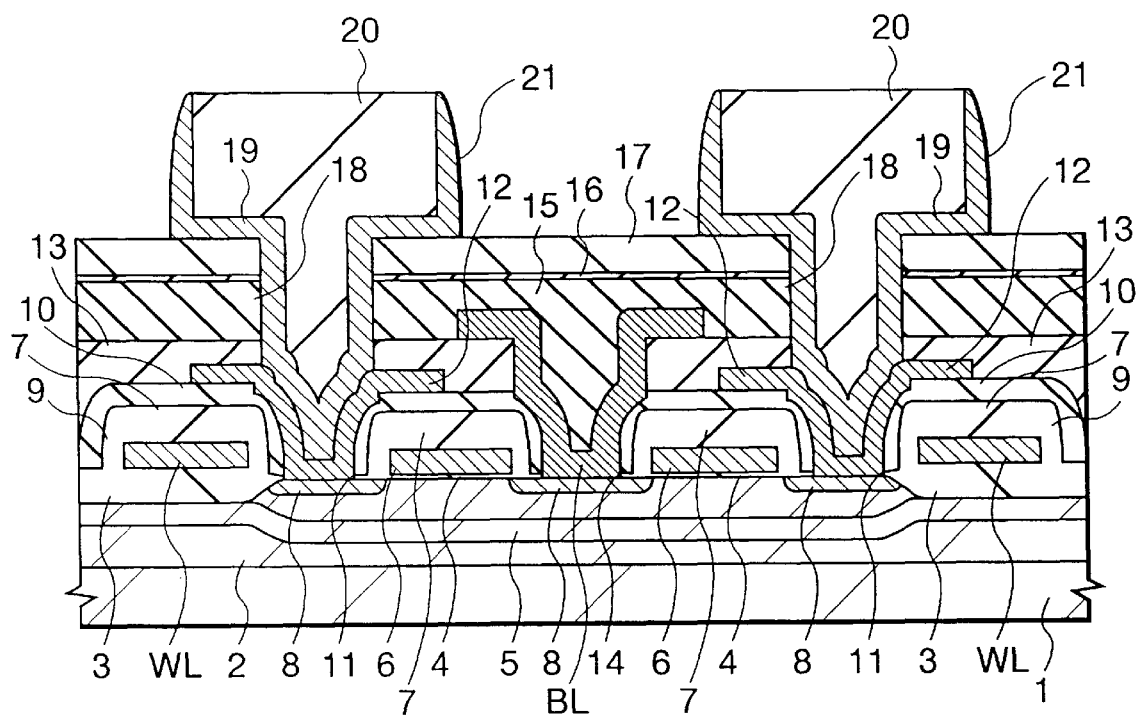
FIG. 13 is a sectional diagram of the essential portion of the semiconductor substrate, showing a step of the method of manufacturing the DRAM of the embodiment according to the present invention.
Figure 14:
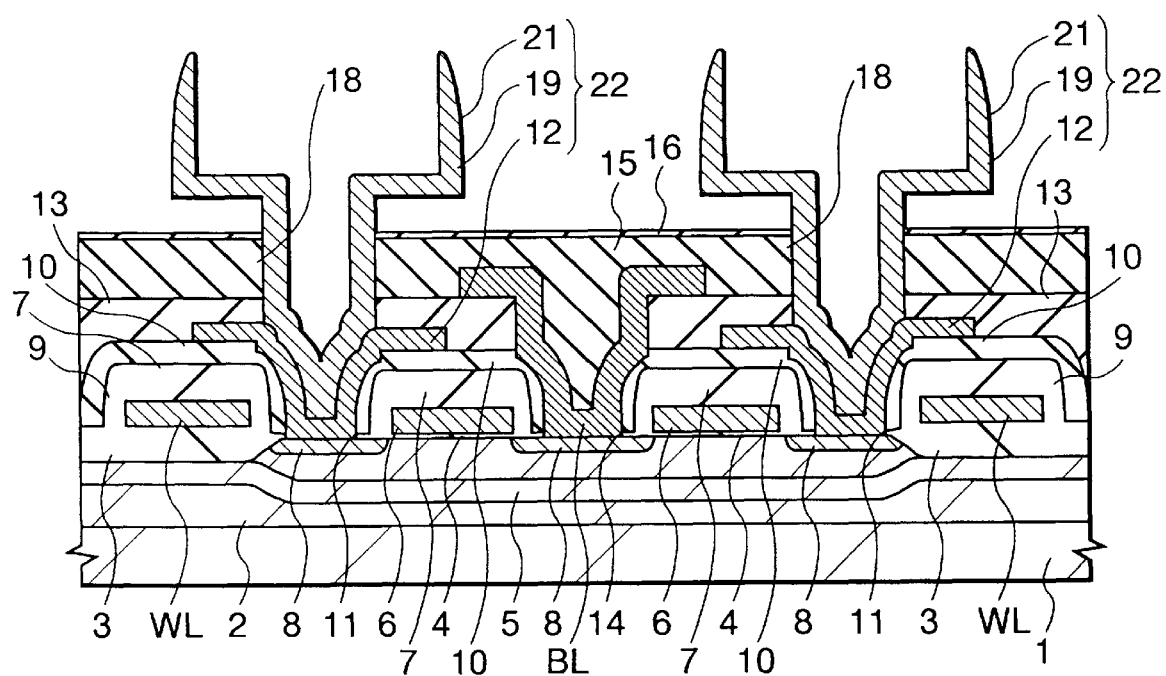
FIG. 14 is a sectional diagram of the essential portion of the semiconductor substrate, showing a step of the method of manufacturing the DRAM of the embodiment according to the present invention.

Next, the polycrystalline silicon film 21 is patterned by the reactive ion etching method so that it is left only on the side walls of the cylindrical silicon oxide film 20, as shown in FIG. 13. After this, the polycrystalline silicon film 19, underlying the polycrystalline silicon film 12, is patterned and only the portions below the silicon oxide film 20 and polycrystalline silicon film 21 forming the side wall of the former.

Next, the silicon oxide film 20 and the underlying silicon oxide film 17 are removed by using a wet etching liquid, such as an aqueous solution of hydrofluoric acid. At this time, the silicon nitride film 16 below the silicon oxide film 17 acts as the etching stopper, so that neither the silicon oxide film 15 nor the BPSG film 13 located below the silicon nitride film 16 are removed. As a result, there are obtained cylindrical (crown-shaped) storage electrodes 22, each of which has three layers of polycrystalline silicon films 12, 19 and 21.

Figure 15:
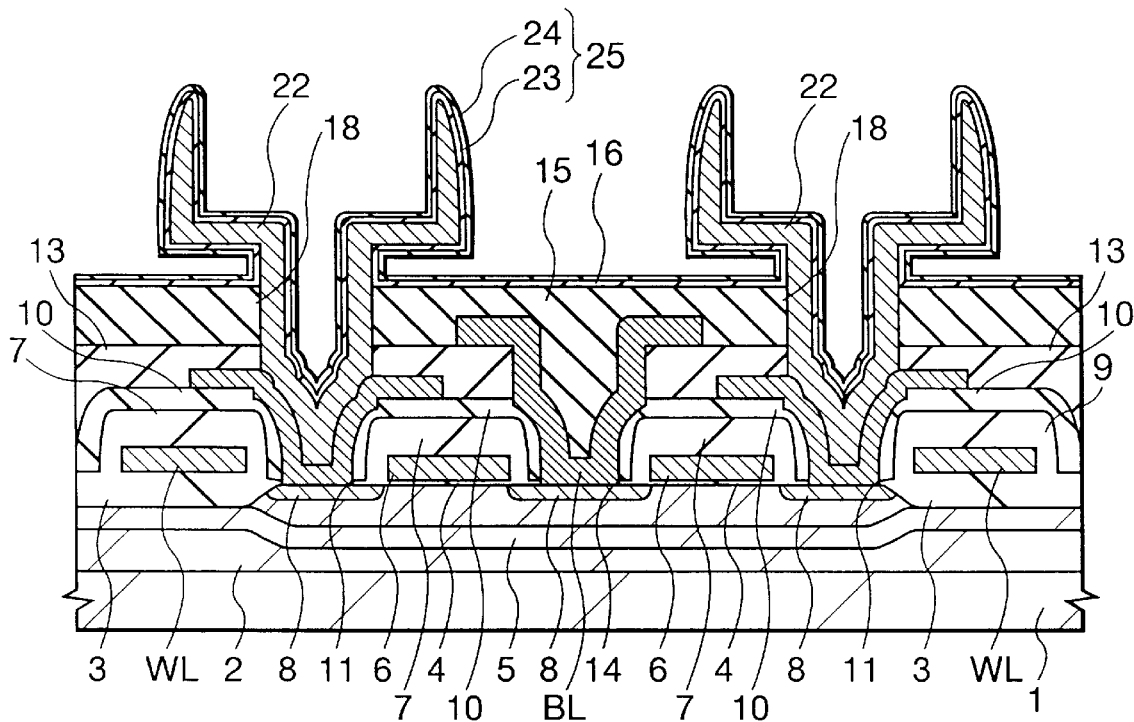
FIG. 15 is a sectional diagram of the essential portion of the semiconductor substrate, showing a step of the method of manufacturing the DRAM of the embodiment according to the present invention.

Next, a silicon nitride film 23 is thinly deposited over the surface of the storage electrodes 22 by the CVD method, as shown in FIG. 15. After this, a tantalum oxide film 24 is thinly deposited over the surface of the silicon nitride film 23 by the CVD method to form a capacitor insulating film 25 for a data storing capacitive element, of a multilayer film having the silicon nitride film 23 and the tantalum oxide film 24. This tantalum oxide film 24 is deposited at a temperature of about 400° C. by using $Ta(OC_2H_5)_5$ (ethoxy tantalum) as the reaction gas and is then annealed at a temperature of about 700 to 1,000° C. by using an electric furnace or a lamp annealing apparatus. Since the silicon nitride film is formed between the tantalum oxide film 24 and the storage electrode, no oxide is formed at the interface between the tantalum oxide film 24 and the lower electrode 22 (polycrystalline silicon film), which may be produced by their reaction at the high temperature annealing.

Figure 18:
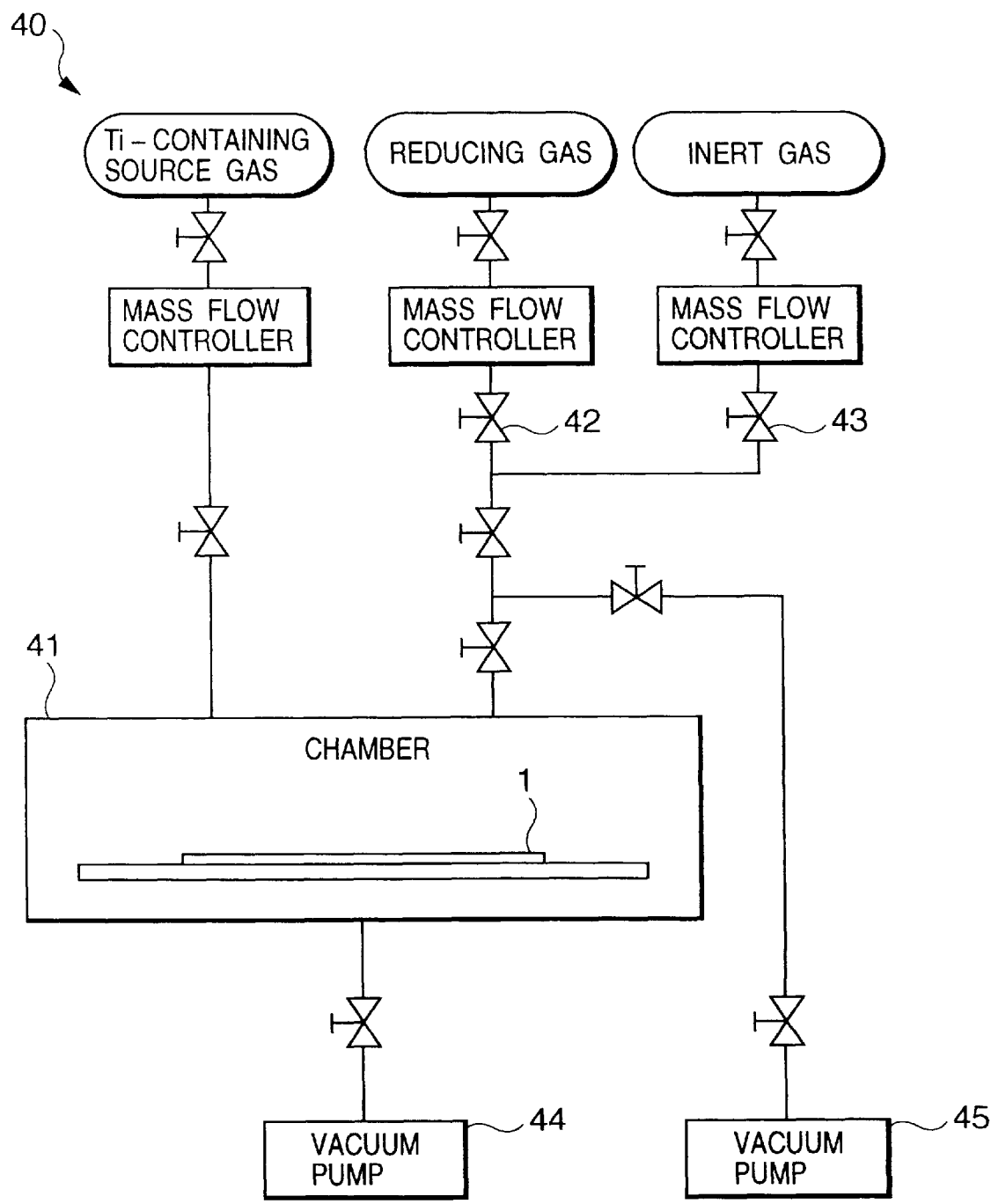
FIG. 18 is a schematic diagram of the essential portion of a CVD apparatus used for manufacturing the DRAM according to the present invention.

Next, the semiconductor substrate 1 is transferred into the chamber 41 of a CVD apparatus 40, as shown in FIG. 18, so that the upper electrodes of the data storing capacitive element may be formed over the capacitor insulating film 25.

As shown in FIG. 18, this CVD apparatus 40 has a structure in which a titanium-containing source gas, such as $TiCl_4$, TDMAT or TDEAT, a nitrogen-containing reducing gas, such as $NH_3$ or MMH for bringing the composition rate of Ti and N close to 1:1, and an inert gas, such as He (helium), Ar (argon) or $N_2$ (nitrogen) are supplied individually through different gas supply pipes into the chamber 41. Thanks to this structure, it is possible to prevent the drawback that the gases react in the individual gas supply pipes so that the reactants deposit on the inner walls of the pipes.

This CVD apparatus is so constructed that only either the nitrogen-containing reducing gas or the inert gas can be selectively introduced into the chamber 41 by controlling the ON/OFF operation of valves 42 and 43 disposed in the gas supply pipe.

In this CVD apparatus 40, moreover, a vacuum pump 45, other than a vacuum pump 44 for adjusting the degree of vacuum in the chamber 41, is connected to a portion of the gas supply pipe for introducing the nitrogen-containing reducing gas into the chamber 41. Thanks to this construction, in which the gas in the gas supply pipe is partially discharged by the vacuum pump 45 at the initial stage at which the nitrogen-containing reducing gas is introduced into the chamber 41, it is possible to prevent the drawback that an excessive amount of nitrogen-containing reducing gas is instantly introduced into the chamber 41.

Figure 16:
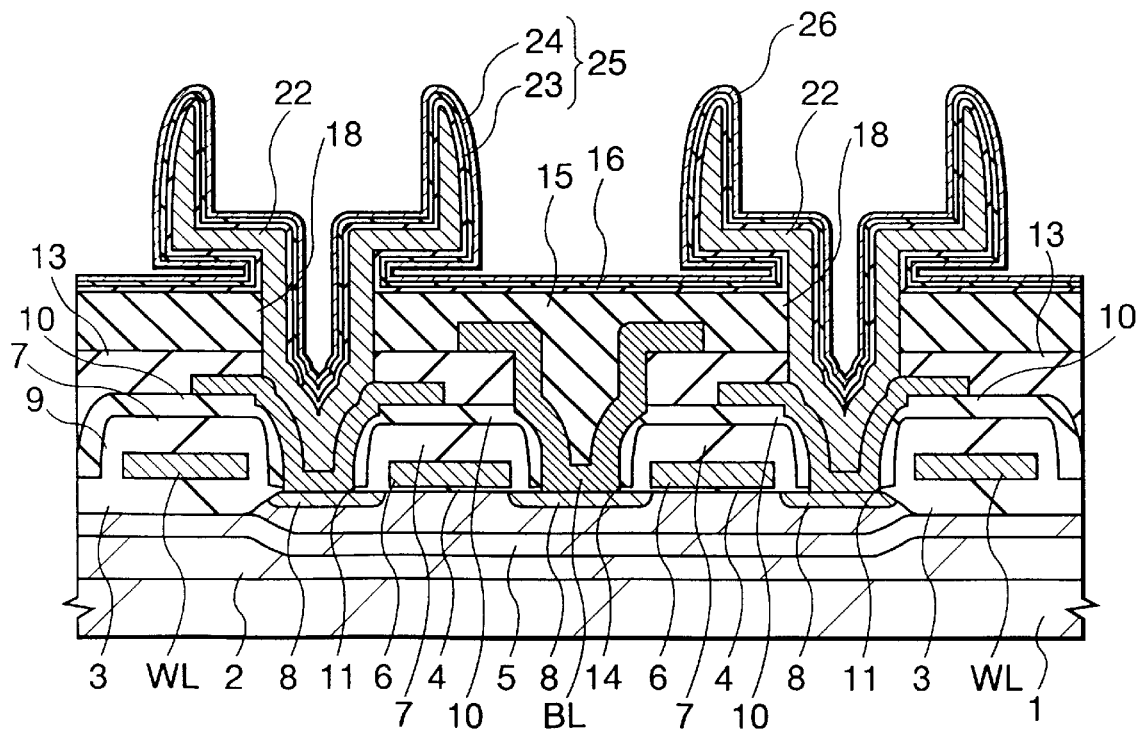
FIG. 16 is a sectional diagram of the essential portion of the semiconductor substrate, showing a step of the method of manufacturing the DRAM of the embodiment according to the present invention.

In the present embodiment, the semiconductor substrate 1 is transferred into the chamber 41 of the aforementioned CVD apparatus 40. After this, the inside of the chamber 41 is evacuated to a predetermined degree of vacuum by the vacuum pump 44. Subsequently, the titanium-containing source gas and the inert gas are introduced at predetermined flow rates into the chamber 41 so that the titanium-containing source gas is thermally decomposed at about 300 to 600° C., more preferably at about 400 to 450° C. to deposit an amorphous Ti film 26 thinly over the surface of the tantalum oxide film 24, as shown in FIG. 16. Incidentally, when either the $N_2$ gas or a mixed gas of $N_2$ and another inert gas is used as the inert gas, there may be formed an amorphous Ti film 26 containing amorphous TiN partially, which raises no problem.

Figure 17:
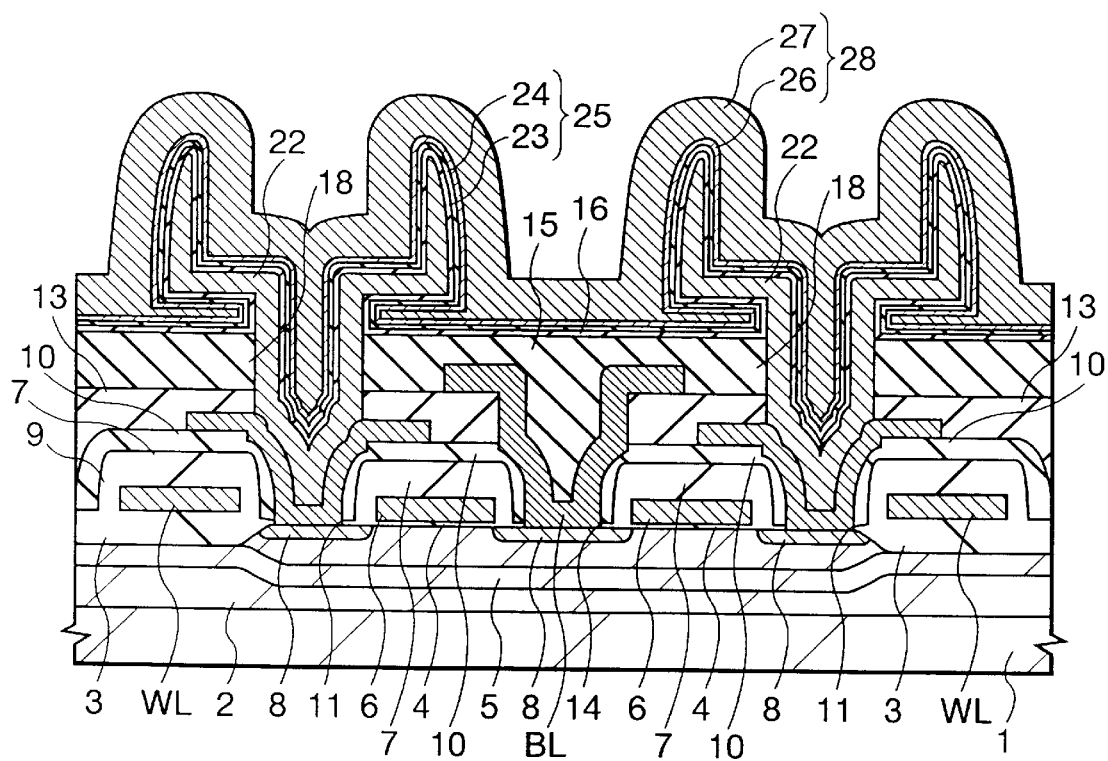
FIG. 17 is a sectional diagram of the essential portion of the semiconductor substrate, showing a step of the method of manufacturing the DRAM of the embodiment according to the present invention.

Next, the titanium-containing source gas, the nitrogen-containing reducing gas and the inert gas are introduced at predetermined flow rates into the chamber 41 of the CVD apparatus 40, so that the titanium-containing source gas and the nitrogen-containing reducing gas react, as shown in FIG. 17, to deposit a TiN film 27 over the amorphous Ti film 26 thereby to form an upper electrode 28 for the data storing capacitive element of a multilayer film of the amorphous Ti film 26 and the TiN film 27.

According to the method thus far described, the surface of the tantalum oxide film 24 is covered with the amorphous Ti film 26, so that the nitrogen-containing reducing gas is kept from contacting the tantalum oxide film 24. As a result, the breakdown strength of the tantalum oxide film can be reliably prevented from being deteriorated by the nitrogen-containing reducing gas. By discharging the gas in the gas supply pipe partially using the vacuum pump 45 at the initial stage at which the nitrogen-containing reducing gas is introduced into the chamber 41 to prevent an excessive amount of nitrogen-containing reducing gas from being instantly introduced into the chamber 41, the composition of Ti and N in the TiN film 27 can be brought close to the optimum value (Ti:N=1:1).

Thus, according to the present embodiment, when the TiN film 27 is deposited by the CVD method over the tantalum oxide film 24 forming the capacitor insulating film 25 of the data storing capacitive element to form the upper electrode 28, an amorphous Ti film 26, which is impermeable to the nitrogen-containing reducing gas, is formed in advance over the surface of the tantalum oxide film 24, so that the breakdown strength (the increase in the leakage current) of the tantalum oxide film 24 can be prevented reliably. As a result, it is possible to realize a DRAM which has improved refresh characteristics.

Embodiment 2

Figure 19:
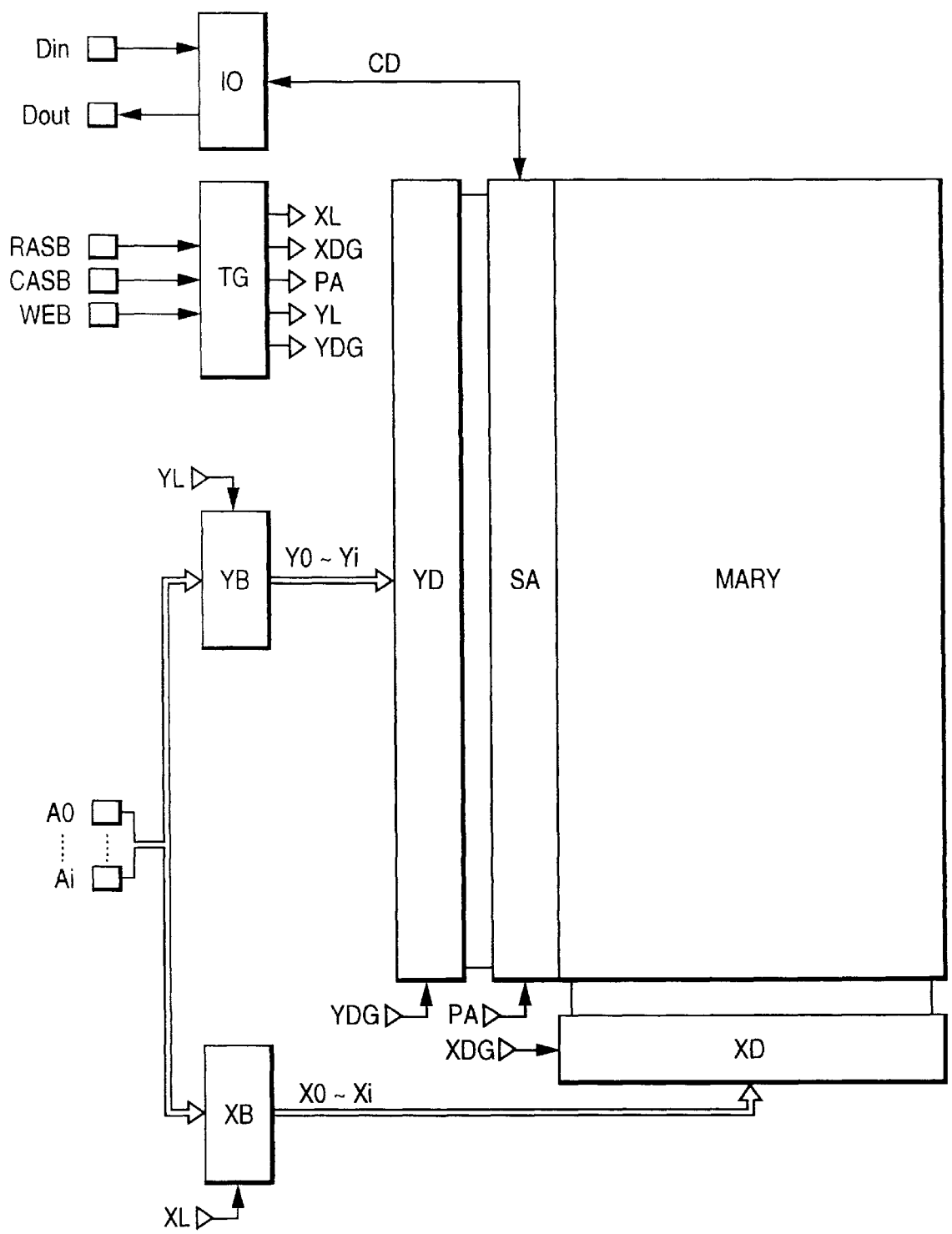
FIG. 19 is a block diagram showing a DRAM of another embodiment according to the present invention.
Figure 20:
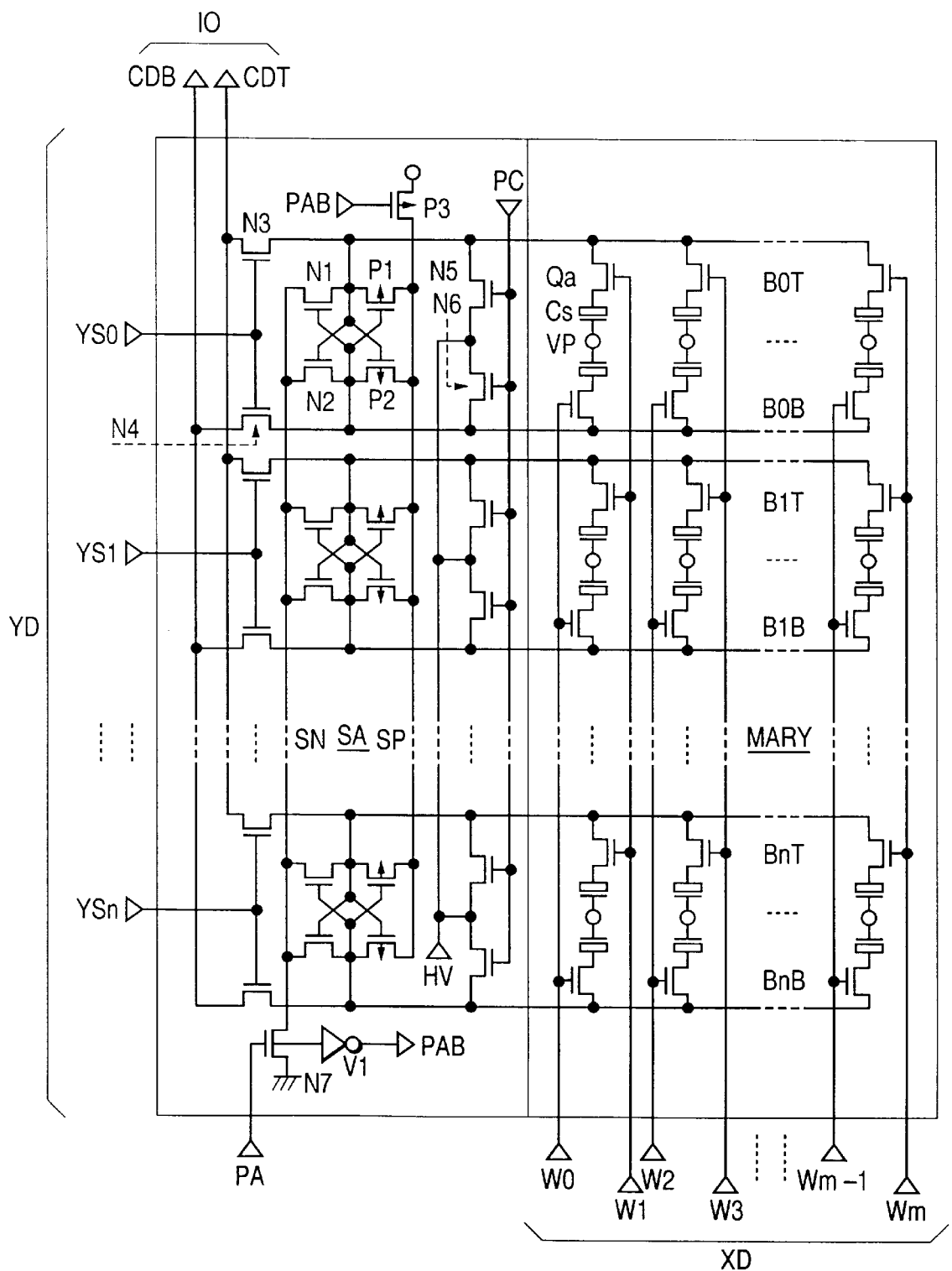
FIG. 20 is a circuit diagram of a memory array and a sense amplifier of the DRAM according to the present invention.

FIG. 19 is a block diagram of a DRAM of the present embodiment, and FIG. 20 is a circuit diagram of a memory array and a sense amplifier of this DRAM.

The DRAM of the present embodiment basically has a memory array MARY which occupies the major portion of the principal face of a semiconductor substrate. This memory array MARY includes, as shown in FIG. 20, (m+1) word lines (W0–Wm) arranged in parallel in the longitudinal direction of the drawing, and (n+1) complementary bit lines (non-inverted bit lines BOT–BNT and inverted bit lines BOB–BOB) arranged in parallel in the horizontal direction. At the intersections of these word lines and complementary bit lines, there are arranged in a lattice shape (m+1)×(n+1) memory cells which have data storing capacitive elements (Cs) and memory cell selecting MISFETs Qa.

The drain regions of (m+1) memory cell selecting MISFETs Qa, arranged in a common column of the memory array MARY, are alternately coupled with a predetermined regularity to the non-inverted or inverted signal lines of the corresponding complementary bit lines. Moreover, the gate electrodes of the memory cell selecting MISFETs Qa of the (n+1) memory cells, arranged in a common row of the memory array MARY, are coupled integrally with the corresponding word lines. A predetermined plate voltage VP is commonly fed to the other electrodes of the data storing capacitive elements (Cs) of all the memory cells constituting the memory array MARY.

The word lines (W0–Wm), constituting the memory array MARY, are coupled therebelow to an X-address decoder XD, and one of them is selectively brought into a selected state. The X-address decoder XD is fed with internal address signals (X0–Xi) of (i+1) bits from an X-address buffer XB and with an internal control signal SDG from a timing generator TG. The X-address buffer XB is fed in a time sharing manner through address input terminals (A0–Ai) with X-address signals (XA0–XAi) and with an internal control signal XL from the timing generator TG.

The X-address buffer XB captures the X-address signals (XA0 to XAi), fed through the address input terminals (A0 to Ai), in accordance with the internal control signal XL and holds them. On the basis of these X-address signals, the X-address buffer XB generates and feeds the internal address signals (X0–Xi) to the X-address decoder XD. This X-address decoder XD is selectively made to operate to decode the internal address signals (X0–Xi) in response to the high level of the internal control signal XDG and brings the corresponding word lines (W0–Wm) of the memory array MARY selectively into a selected state of the high level.

The complementary bit lines (BOT–BNT and BOB–BNB), constituting the memory array MARY, are coupled to a sense amplifier SA and are selectively connected therethrough to a complementary common data line CD. This sense amplifier SA is fed with bit line select signals (YS0–YSn) of (n+1) bits from a Y-address decoder YD and with an internal control signal PA from the timing generator TG. The Y-address decoder YD is fed with internal address signals (Y0–Yi) of (i+1) bits from a Y-address buffer YB and with an internal control signal YDG from the timing generator TG. Moreover, the Y-address buffer YB is fed in a time sharing manner through the address input terminals (A0–Ai) with Y-address signals (AY0–AYi) and with an internal control signal YL from the timing generator TG.

The Y-address buffer YB captures the Y-address signals (YA0 to YAi), fed through the address input terminals (A0 to Ai), in accordance with the internal control signal YL and holds them. On the basis of these Y-address signals, the Y-address buffer YB generates and feeds the internal address signals (Y0–Yi) to the Y-address decoder YD. The Y-address decoder YD is selectively made to operate to decode the internal address signals (Y0–Yi) in response to the high level of the internal control signal YDG and brings the corresponding bit-line selecting signals (YS0–YSn) selectively into a selected state of the high level.

The sense amplifier SA includes (n+1) unit circuits which are so provided as to correspond to the complementary bit lines of the memory array MARY. Each of these unit circuits includes, as typically shown in FIG. 20, a bit line precharge circuit arranged between the non-inverted and inverted signal lines of the complementary bit lines and having a pair of n-channel MISFETs N5 and N6; and a unit amplifier having a CMOS inverter having a p-channel MISFET P1 and an n-channel MISFET N1 and a CMOS inverter cross-connected with the former inverter and having a p-channel MISFET P2 and an n-channel MISFET N2, although the invention is not limited thereto. Of these, the commonly coupled source regions of the n-channel MISFETs N5 and N6, constituting the bit line precharge circuit of each unit circuit, are commonly fed with an internal voltage HV, and the gate electrodes of the same are commonly fed with an internal control signal PC. Incidentally, the internal voltage HV is an intermediate potential between the power supply voltage of the circuit and the ground potential. The internal control signal PC is selectively brought to the high level when the memory cell is not selected. As a result, when the memory cell is not selected but the internal control signal PC is set at the high level, the n-channel MISFETs N5 and N6 are selectively turned on together to precharge the non-inverted and inverted signal lines of the corresponding complementary bit lines of the memory array MARY to the internal voltage HV.

The source regions of the p-channel MISFETs P1 and P2, constituting the unit amplifier of each unit circuit, are commonly coupled to a common source line SP. This common source line SP is coupled to the power supply voltage of the circuit through a p-channel drive MISFET P3 which receives, at its gate electrode, an inverted internal control signal PAB, i.e., a signal which is formed by inverting the internal control signal PA using an inverter V1. Likewise, the source regions of the n-channel MISFETs N1 and N2, constituting the unit amplifier of each unit circuit, are commonly coupled to a common source line SN. This common source line SN is coupled to the ground potential of the circuit through an n-channel drive MISFET N7 which receives the internal control signal PA at its gate electrode. As a result, the individual unit amplifiers are selectively made to operate altogether, when the internal control signal PA is set at the high level, whereas the inverted internal control signal PAB is set at the low level, to amplify the minute read signal outputted from the (n+1) memory cells coupled to the selected word lines of the memory array MARY through the corresponding complementary bit lines, thereby to generate binary read signals of the high or low level.

Each unit circuit of the sense amplifier SA further includes a pair of n-channel switch MISFETs N3 and N4 which are interposed between the non-inverted and inverted input/output nodes of the unit amplifier and the complementary common data line CD. The gate electrodes of these paired switch MISFETs are commonly coupled, so that they are individually fed with the bit line select signals (YS0–YSn) from the Y-address decoder YD. As a result, the switch MISFETs N3 and N4 of each unit circuit are selectively turned on, when the corresponding bit line select signals (YS0–YSn) are set at the high level, to connect the corresponding unit amplifier of the sense amplifier SA, i.e., the corresponding pair of complementary bit lines of the memory array MARY selectively with the complementary common data line CD.

This complementary common data line CD, with which is connected the designated pair of the complementary bit lines of the memory array MARY, is coupled to a data input/output circuit IO. This data input/output circuit IO includes a write amplifier, a main amplifier, a data input buffer and a data output buffer, although not shown. Of these, the output terminal of the write amplifier and the input terminal of the main amplifier are commonly coupled to the complementary common data line CD. The input terminal of the write amplifier is coupled to the output terminal of the data input buffer, the input terminal of which is coupled to a data input terminal Din. Moreover, the output terminal of the main amplifier is coupled to the input terminal of the data output buffer, the output terminal of which is coupled to a data output terminal Dout.

When the memory cell is brought into a selected state in the write mode, the data input buffer of the data input/output circuit IO captures the write data fed through the data input terminal Din to transmit the data to the write amplifier. This write data is changed into predetermined complementary write signals by the write amplifier and then written through the complementary common data line CD in one selected memory cell of the memory array MARY. When the memory cell is brought into a selected state in the read mode, the main amplifier of the data input/output circuit IO further amplifies the binary read signal outputted from the selected memory cell of the memory array MARY through the complementary common data line CD, to transmit the amplified signal to the data output buffer. This read data is sent out from the data output buffer through the data output terminal Dout.

The timing generator TG generates the aforementioned various internal control signals selectively on the basis of a row address strobe signal RASB, a column address strobe signal CASB and a write enable signal WEB fed as the start control signals from the outside, to feed the generated internal control signals to the individual parts of the DRAM.

With reference to FIGS. 21 to 47, a method of manufacturing a DRAM of the present embodiment will be described.

Figure 21:
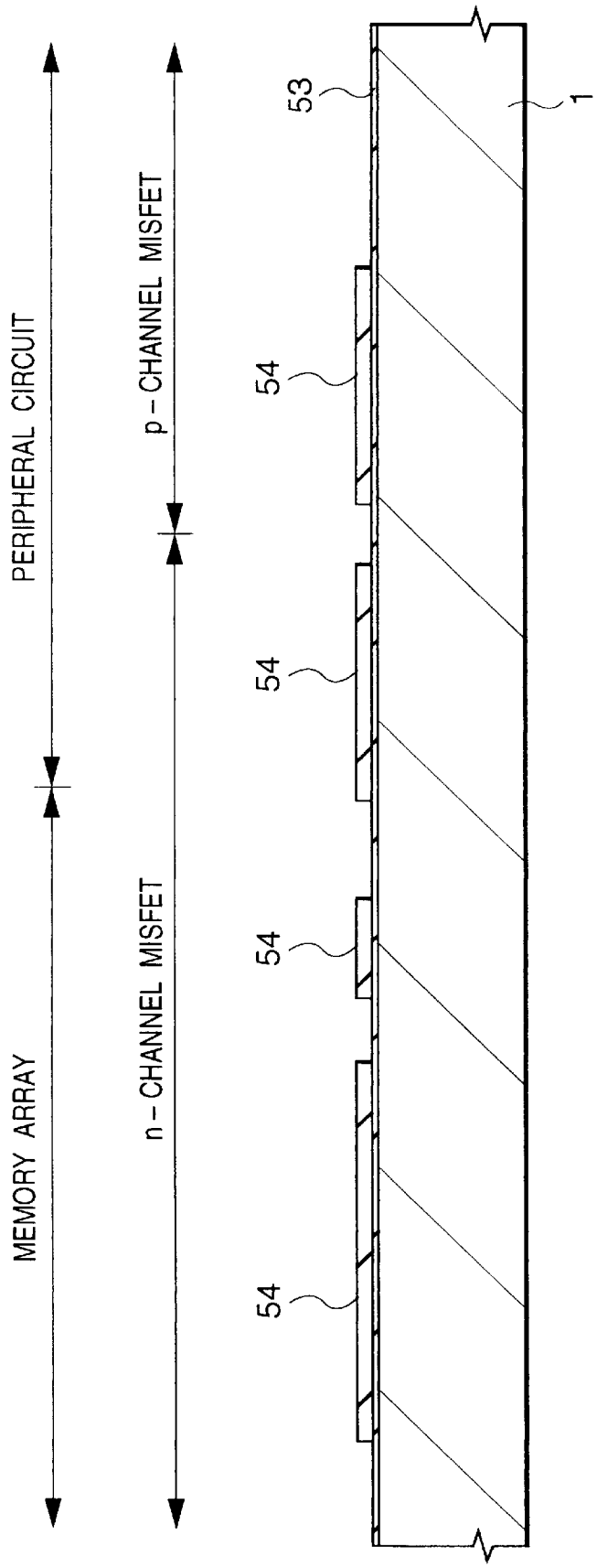
FIG. 21 is a sectional diagram of an essential portion of a semiconductor substrate, showing a step of the method of manufacturing the DRAM of the embodiment according to the present invention.

In order to manufacture this DRAM, the surface of the semiconductor substrate 1 made of p-type monocrystalline silicon is oxidized at first, as shown in FIG. 21, to form a thin silicon oxide film 53. After this, the CVD method is used to deposit a silicon nitride film 54 over the silicon oxide film 53. Next, the silicon nitride film 54 is etched by using a photoresist as the mask, to remove the silicon nitride film 54 of the element isolating region.

Figure 22:
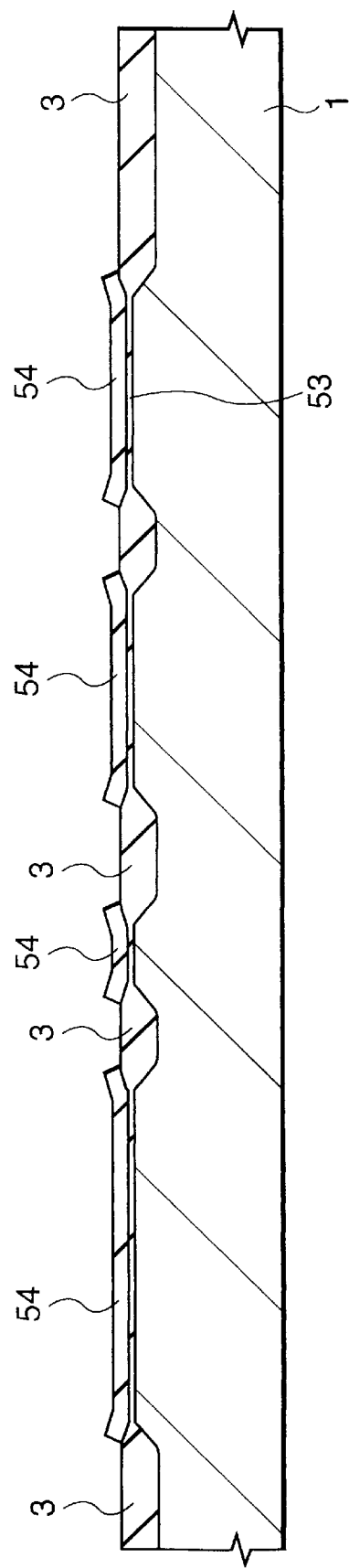
FIG. 22 is a sectional diagram of the essential portion of the semiconductor substrate, showing a step of the method of manufacturing the DRAM of the embodiment according to the present invention.
Figure 23:
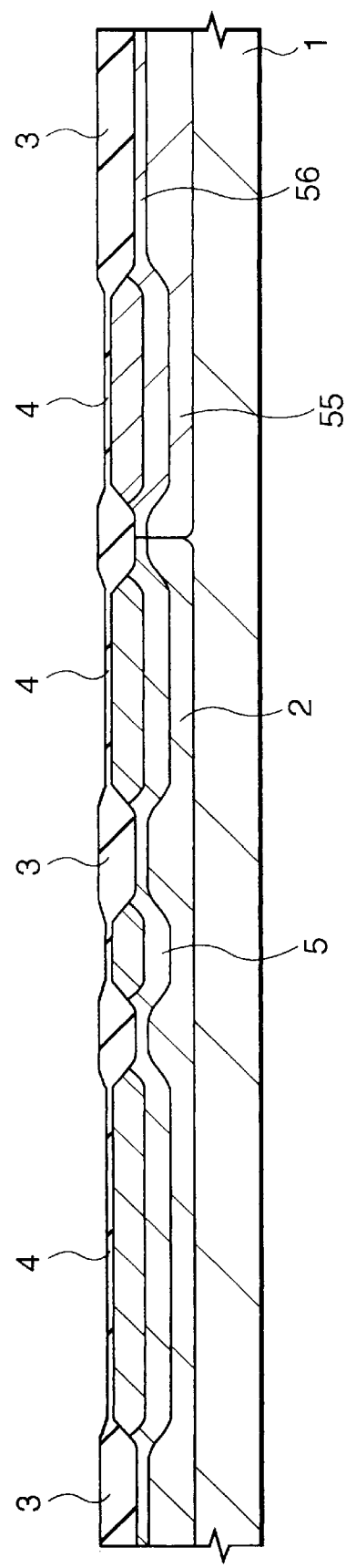
FIG. 23 is a sectional diagram of the essential portion of the semiconductor substrate, showing a step of the method of manufacturing the DRAM of the embodiment according to the present invention.

Next, the semiconductor substrate 1 is annealed by using the silicon nitride film 54 as the mask, as shown in FIG. 22, to form the field oxide film 3. Next, the silicon nitride film 54 is removed, and the regions of the semiconductor substrate 1 where the memory array and the n-channel MISFET of the peripheral circuit are to be formed are doped with ions of a p-type impurity (boron (B)) to form the p-type well 2, as shown in FIG. 23. The regions of the semiconductor substrate 1, where the p-channel MISFET of the peripheral circuit is to be formed is also doped with ions of an $n^-$-type impurity (phosphor (P)) to form an $n^-$-type well 55. Subsequently, the p-type well 2 is doped with ions of the p-type impurity (B) to form the p-channel stopper layer 5, and the $n^-$-type well 55 is doped with ions of the $n^-$-type impurity (P) to form the $n^-$-type channel stopper layer 6. After this, the surfaces of the individual active regions of the p-type well 2 and the $n^-$-type well 55 defined by the field oxide film 3 are thermally oxidized to form the gate oxide film 4.

Figure 24:
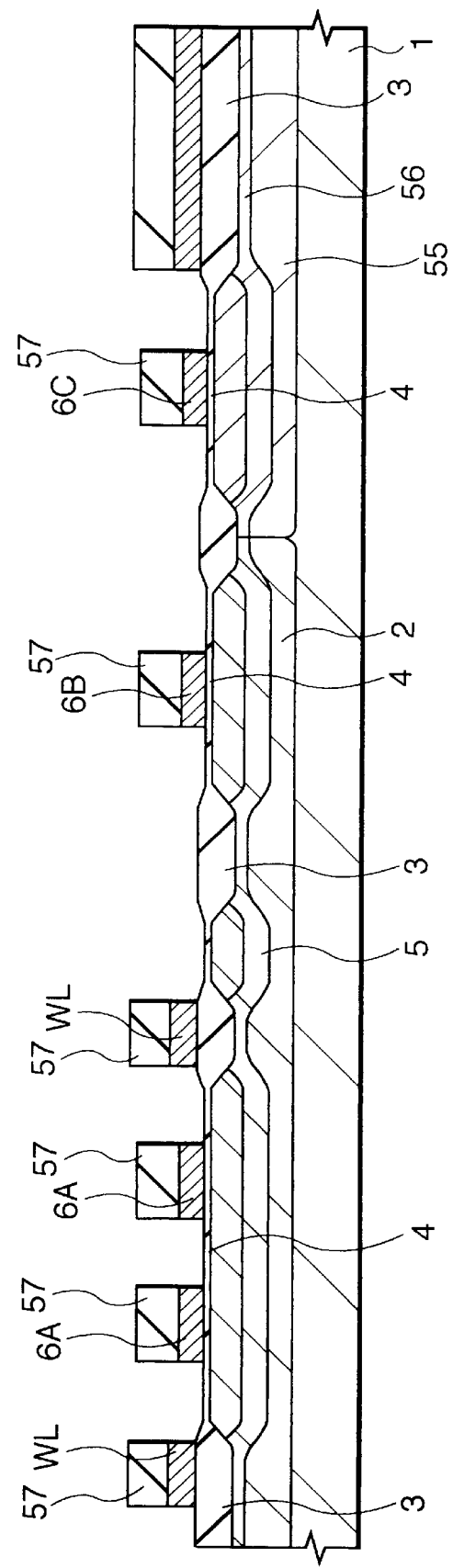
FIG. 24 is a sectional diagram of the essential portion of the semiconductor substrate, showing a step of the method of manufacturing the DRAM of the embodiment according to the present invention.

Next, there are formed a gate electrode 6A (the word line WL) of the memory cell selecting MISFET, and a gate electrode 6B of the n-channel MISFET and a gate electrode 6C of the p-channel MISFET of the peripheral circuit, as shown in FIG. 24. The gate electrode 6A (the word line WL) and the gate electrodes 6B and 6C are simultaneously formed by depositing a tungsten (W) film over the semiconductor substrate 1 by the CVD method, by depositing a silicon nitride film 57 over the W film by the plasma CVD method, and then by patterning those films by the etching method using a photoresist as its mask.

Figure 25:
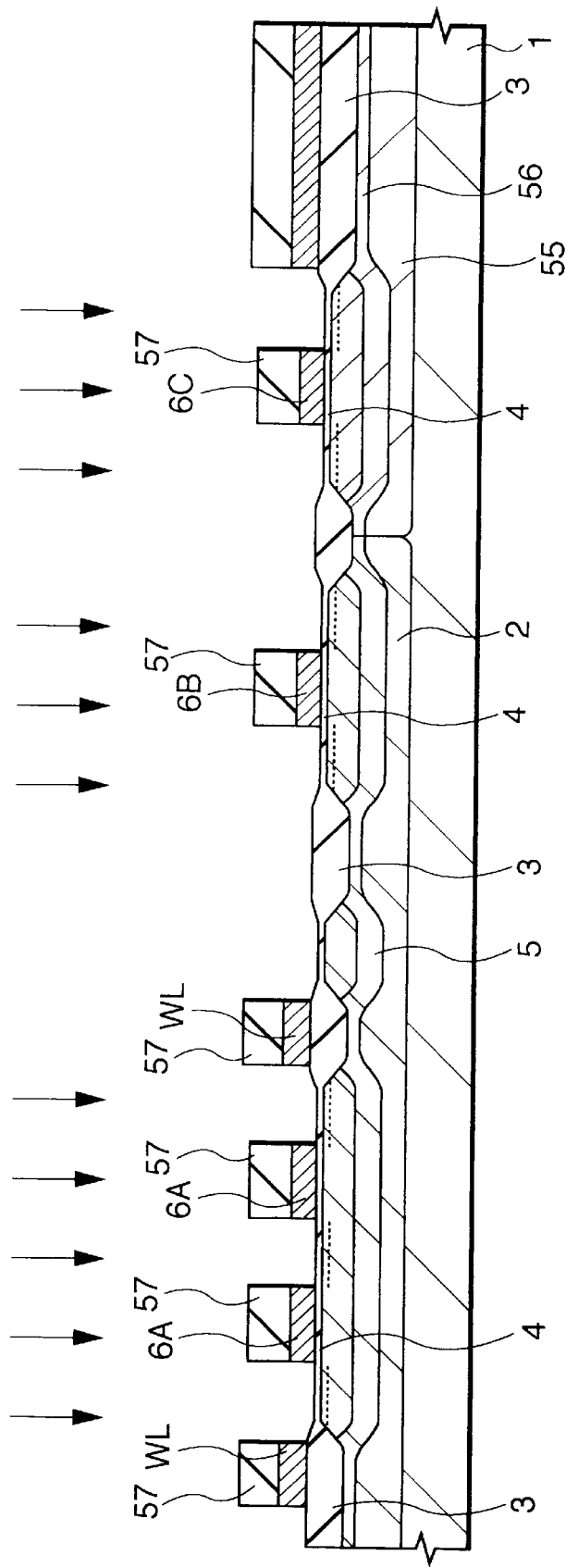
FIG. 25 is a sectional diagram of the essential portion of the semiconductor substrate, showing a step of the method of manufacturing the DRAM of the embodiment according to the present invention.

Next, the p-type well 2 is doped with ions of the $n^-$-type impurity (P), and the $n^-$-type well 55 is doped with the ions of the p-type impurity (B), as shown in FIG. 25. By the later annealing step, the $n^-$-type impurity (P) forms the $n^-$-type semiconductor region 8 (the source region and the drain region) of the memory cell selecting MISFET and an $n^-$-type semiconductor region 58 of the n-channel MISFET of the peripheral circuit, and the p-type impurity (B) forms a p-type semiconductor region 59 of the p-channel MISFET of the peripheral circuit.

Figure 26:
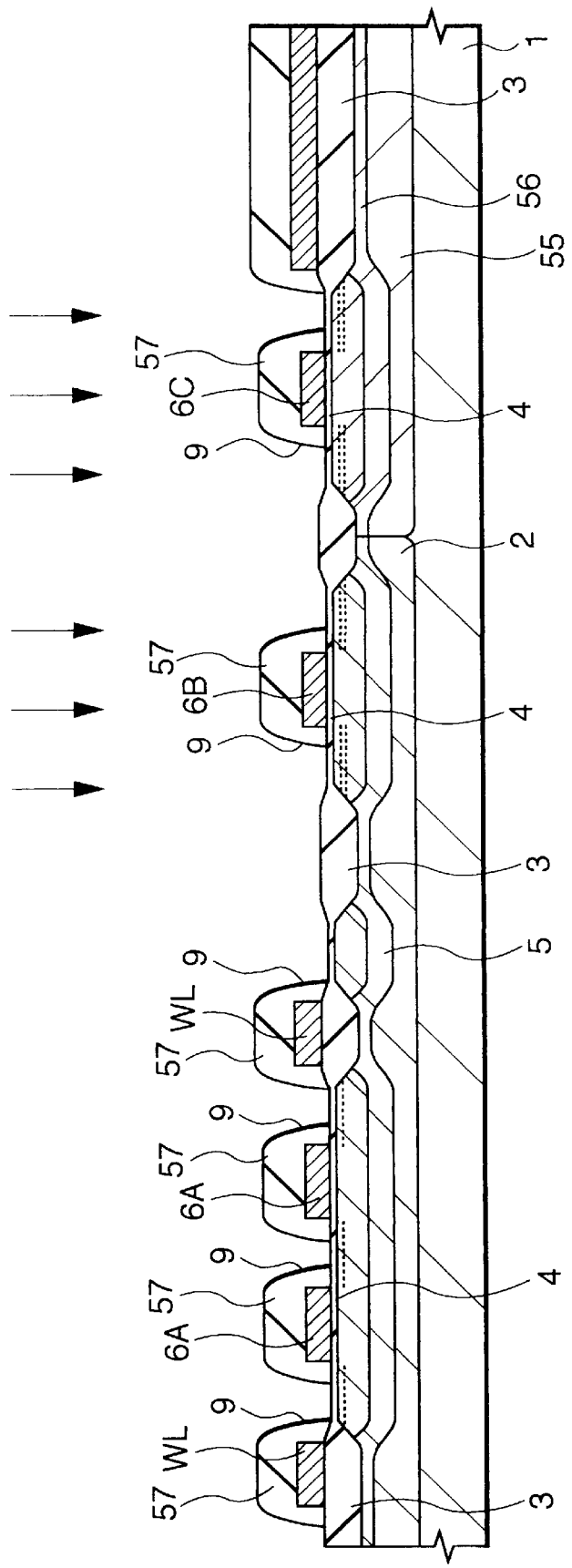
FIG. 26 is a sectional diagram of the essential portion of the semiconductor substrate, showing a step of the method of manufacturing the DRAM of the embodiment according to the present invention.

Next, the side wall spacers 9 are formed on the individual side walls of the gate electrode 6A (the word line WL) and the gate electrodes 6B and 6C, as shown in FIG. 26. After this, the p-type well 2 of the peripheral circuit is doped with ions of the $n^-$-type impurity (P), and the n-type well 55 is doped with ions of the p-type impurity (B). The side wall spacers 9 are formed by depositing a silicon nitride film over the semiconductor substrate 1 by the plasma CVD method and then by processing the silicon nitride film by the anisotropic etching method.

Figure 27:
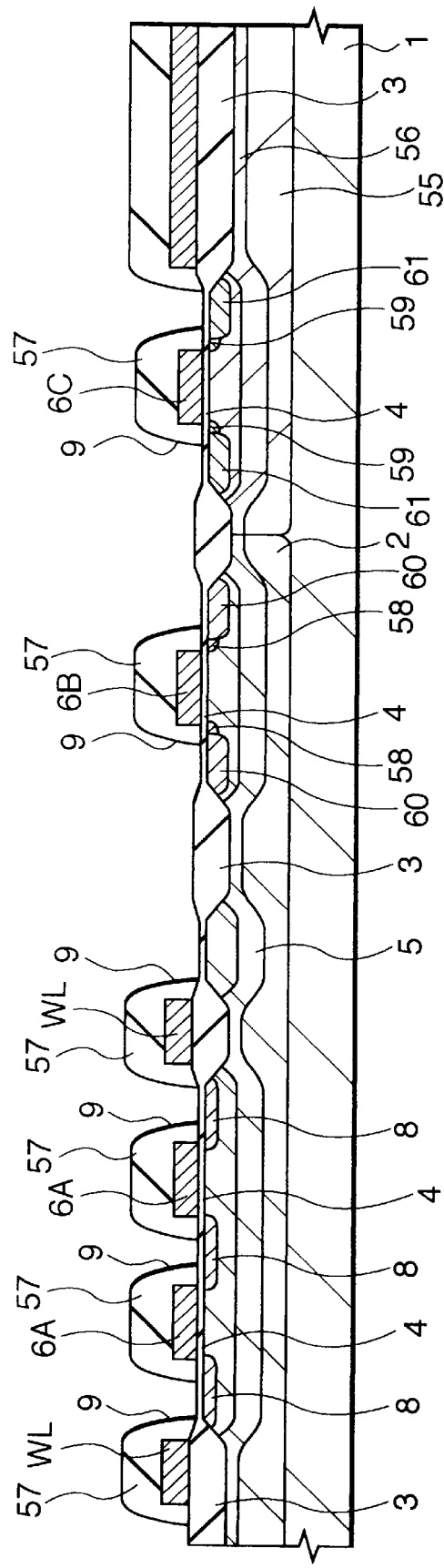
FIG. 27 is a sectional diagram of the essential portion of the semiconductor substrate, showing a step of the method of manufacturing the DRAM of the embodiment according to the present invention.

Next, the semiconductor substrate 1 is annealed in an atmosphere of nitrogen to diffuse the aforementioned $n^-$-type impurity (P) and p-type impurity, as shown in FIG. 27, thereby to form the $n^-$-type semiconductor region 8 (the source region and the drain region) of the memory cell selecting MISFET, the $n^-$-type semiconductor region 58 and an $n^+$-type semiconductor region 60 of the n-channel type MISFET and the $p^-$-type semiconductor region 59 and a $p^+$-type semiconductor region 61 of the p-channel MISFET of the peripheral circuit. The source region and drain region of the n-channel MISFET of the peripheral circuit individually have an LDD (Lightly Doped Drain) structure having the $n^-$-type semiconductor region 58 and the $n^+$-type semiconductor region 60, and the source region and drain region of the p-channel MISFET individually have an LDD structure having the $p^-$-type semiconductor region 59 and the $p^+$-type semiconductor region 61.

Figure 28:
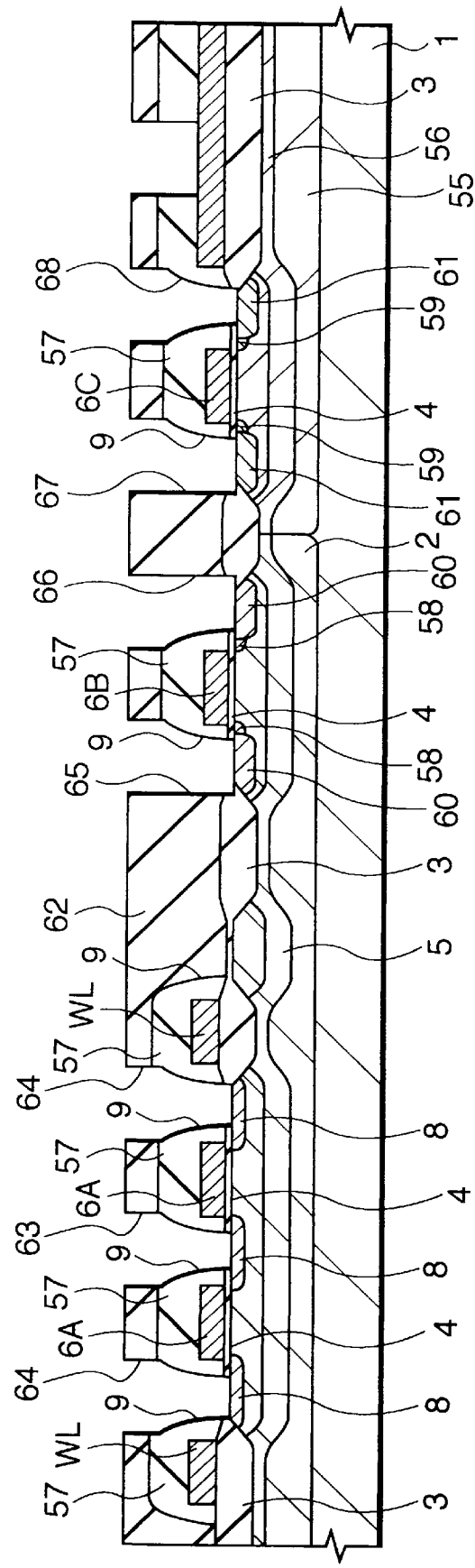
FIG. 28 is a sectional diagram of the essential portion of the semiconductor substrate, showing a step of the method of manufacturing the DRAM of the embodiment according to the present invention.

Next, a silicon oxide film 62 is deposited over the memory cell selecting MISFET and the n-channel MISFET and the p-channel MISFET of the peripheral circuit by the plasma CVD method, as shown in FIG. 28, and is polished to flatten the surface by the chemino-mechanical polishing (CMP) method. After this, the silicon oxide film 62 and the gate oxide film 4 are etched by using a photoresist as the mask to make connection holes 63 and 64 over the n-type semiconductor region 8 (the source region and the drain region) of the memory cell selecting MISFET, connection holes 65 and 66 over the $n^+$-type semiconductor region 60 (the source region and the drain region) of the n-channel type MISFET of the peripheral circuit, and connection holes 67 and 68 over the $p^+$-type semiconductor region 61 (the source region and the drain region) of the p-channel type MISFET.

At this time, the silicon nitride film 57 formed over the gate electrode 6A (the word line WL) of the memory cell selecting MISFET, and the side wall spacers 9 of silicon nitride formed on the side walls are slightly etched, so that the connection holes 63 and 64 are formed in a self-alignment manner. Likewise, the silicon nitride film 57 formed over the gate electrode 6B of the n-channel MISFET of the peripheral circuit and the gate electrode 6C of the p-channel MISFET, and the side wall spacers 9 formed on the side walls are slightly etched, so that the connection holes 65 to 68 are formed in a self-alignment manner.

The insulating films deposited over the memory cell selecting MISFET and the n-channel MISFET and p-channel MISFET of the peripheral circuit can be exemplified by not only the aforementioned silicon oxide film 62, but also by an ozone ($O_3$)-BPSG film deposited by the CVD method, or an ozone-TEOS (Tetra Ethoxy Silane) deposited by the CVD method. The surfaces of the insulating films are flattened like the silicon oxide film 62 by the chemino-mechanical polishing (CMP) method.

Figure 29:
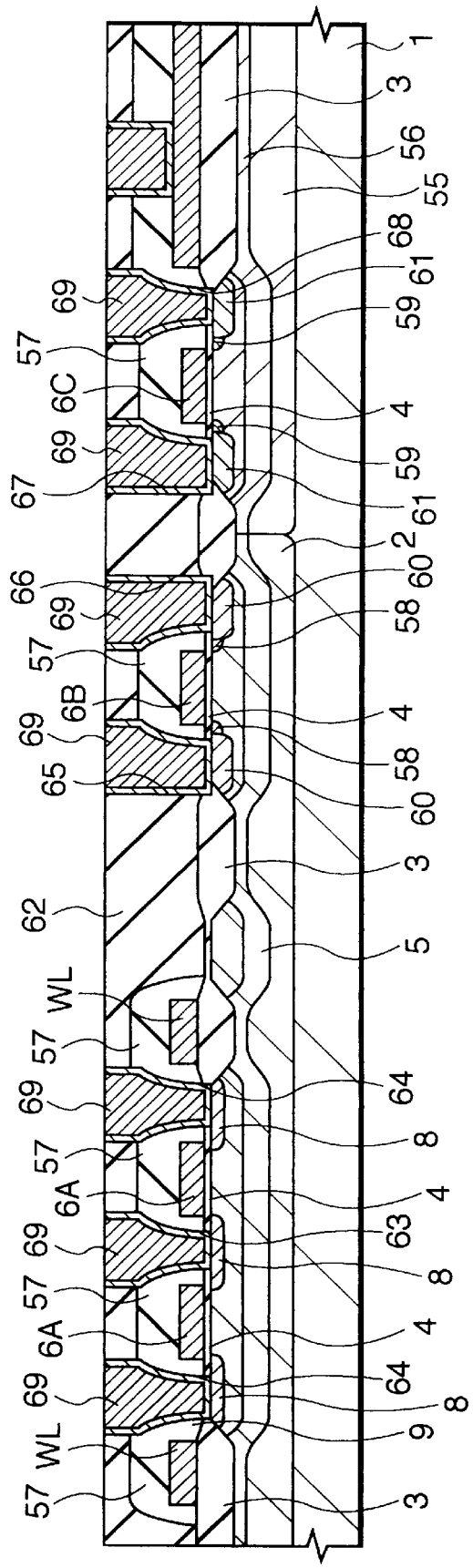
FIG. 29 is a sectional diagram of the essential portion of the semiconductor substrate, showing a step of the method of manufacturing the DRAM of the embodiment according to the present invention.

Next, plugs 69 made of a multilayered film of TIN and W are buried in the connection holes 63 to 68, as shown in FIG. 29. These plugs 69 are formed by depositing the TiN film of the bonding layer between the substrate and the W film over the silicon oxide film 62 by the sputtering method, by subsequently depositing a W film over the TiN film by the CVD method and then by etching back the W film and the TiN film.

At this time, a Ti silicide ($TiSi_2$) layer may be formed over the bottoms of the connection holes 63 to 68 so as to reduce the contact resistance between the plugs 69 and the substrate. The Ti silicide layer is formed by depositing the Ti film over the silicon oxide film 62 by the sputtering method, causing the Ti film and the substrate over the bottoms of the connection holes 63 to 68 to react with each other by the annealing method at about 800° C., and then removing the unreacted Ti film left over the silicon oxide film 62 by the wet etching method. After this, the TiN film and the W film deposited over the silicon oxide film 62 are etched back to form the plugs 69.

Figure 30:
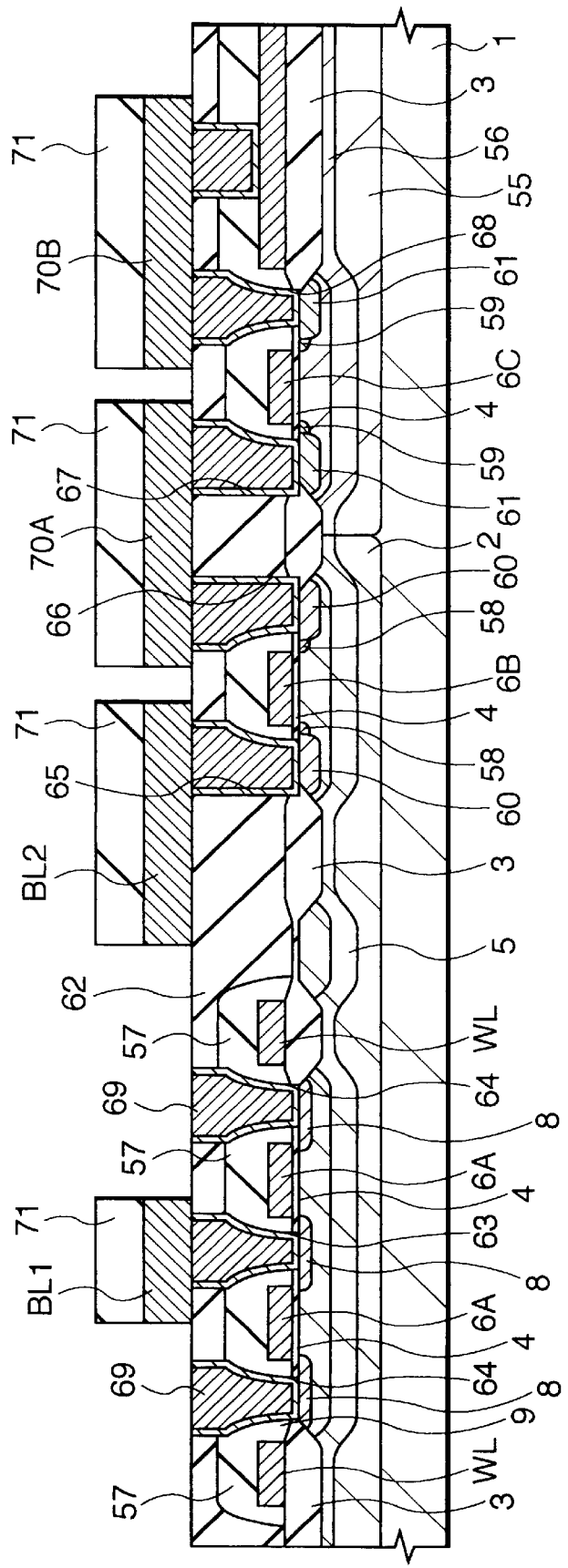
FIG. 30 is a sectional diagram of the essential portion of the semiconductor substrate, showing a step of the method of manufacturing the DRAM of the embodiment according to the present invention.

Next, bit lines $BL_1$ and $BL_2$ and wiring lines 70A and 70B of the peripheral circuit are formed over the silicon oxide film 62, as shown in FIG. 30. These bit lines $BL_1$ and $BL_2$ and wiring lines 70A and 70B are simultaneously formed by depositing a W film over the silicon oxide film 62 by the plasma CVD method, by subsequently depositing a silicon nitride film 71 over the W film by the CVD method and then by patterning those films by the etching method using a photoresist as the mask.

The bit line $BL_1$ is electrically connected through the connection hole 63 with one (an $n^-$-type semiconductor region 8) of the source region and drain region of the memory cell selecting MISFET. The bit line $BL_2$ is electrically connected through the connection hole 65 with one ($n^+$-type semiconductor region 60) of the source region and drain region of the n-channel type MISFET Qn of the peripheral circuit.

One end of the wiring line 70A of the peripheral circuit is electrically connected through the connection hole 66 with the other (or the $n^+$-type semiconductor region 60) of the source region and drain region of the n-channel MISFET, and the other end is electrically connected through the connection hole 67 with one (the $p^+$-type semiconductor region 61) of the source region and drain region of the p-channel MISFET. The wiring line 70B is electrically connected through the connection hole 68 with the other (the $p^+$-type semiconductor region 61) of the source region and drain region of the p-channel MISFET.

Figure 31:
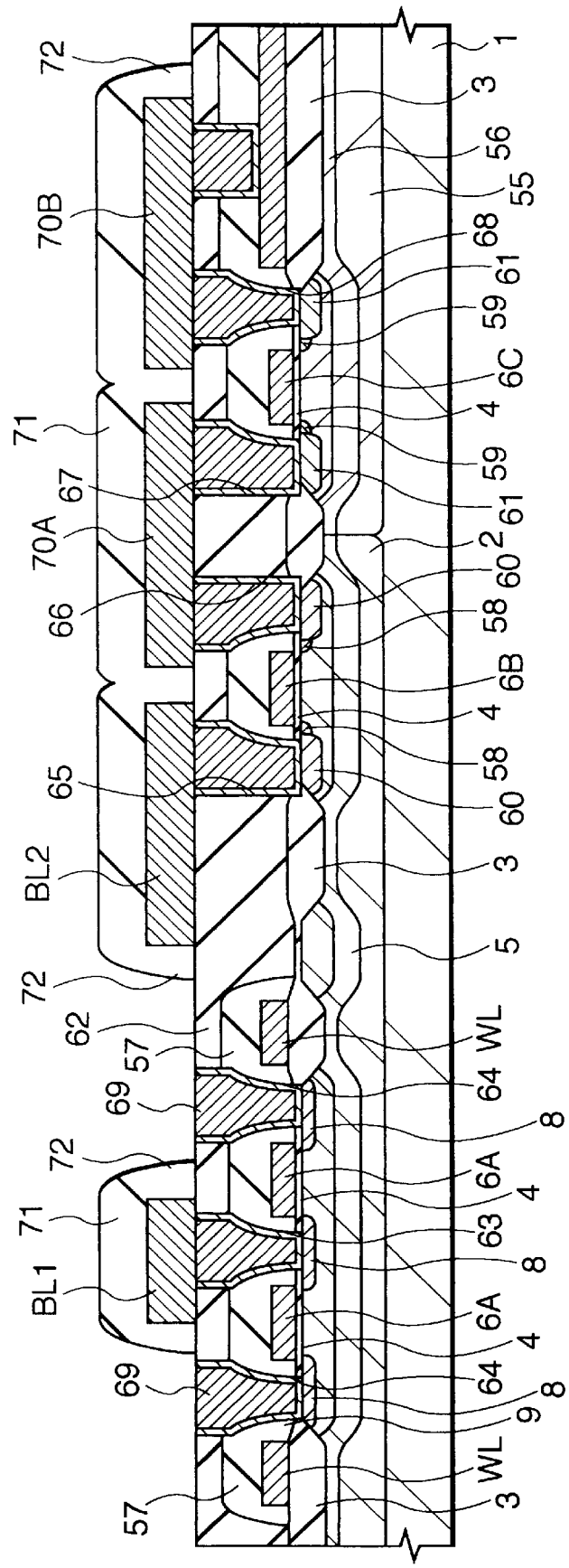
FIG. 31 is a sectional diagram of the essential portion of the semiconductor substrate, showing a step of the method of manufacturing the DRAM of the embodiment according to the present invention.

Next, side wall spacers 72 are formed over the individual side walls of the bit lines $BL_1$ and $BL_2$ and the wiring lines 70A and 70B, as shown in FIG. 31. These side wall spacers 72 are formed by depositing a silicon nitride film over the silicon oxide film 62 by the plasma CVD method and then by processing the silicon nitride film by the anisotropic etching method.

Figure 32:
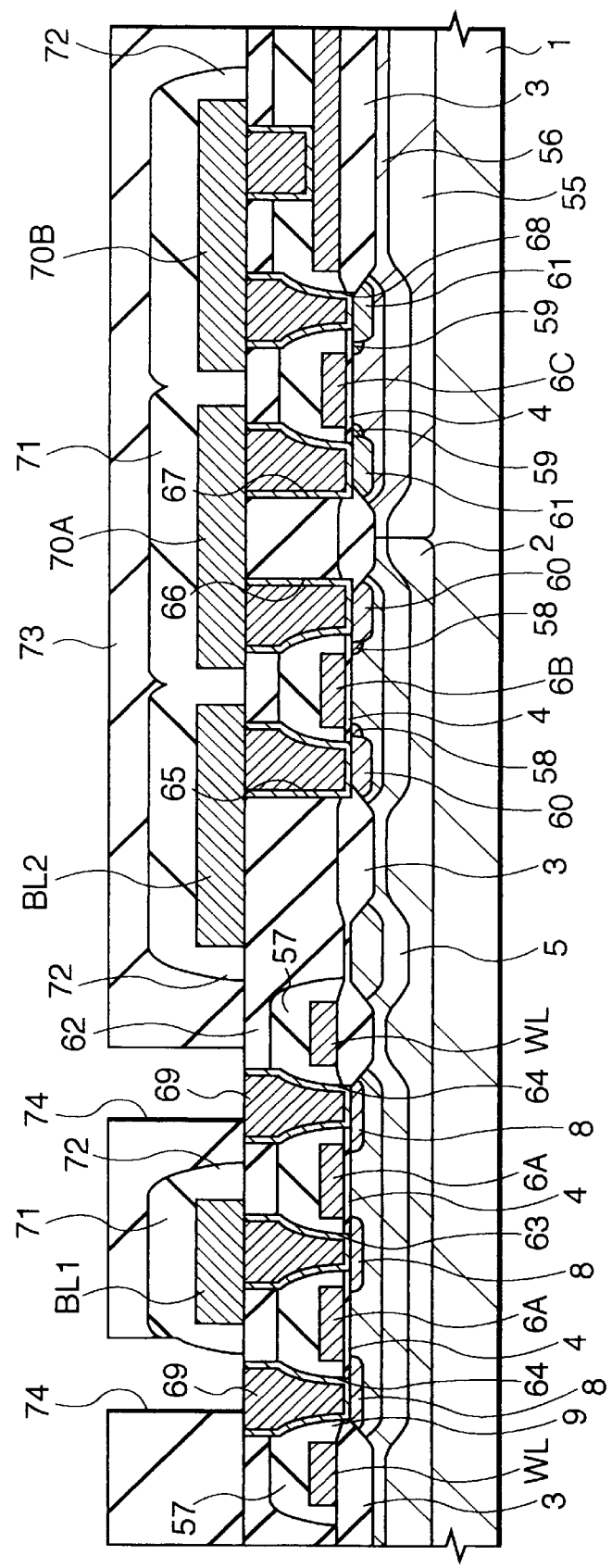
FIG. 32 is a sectional diagram of the essential portion of the semiconductor substrate, showing a step of the method of manufacturing the DRAM of the embodiment according to the present invention.

Next, connection holes 74 are formed above the aforementioned connection holes 64 which are formed over one of the n-type semiconductor region 8 (the source region and the drain region) of the memory cell selecting MISFET, as shown in FIG. 32, by depositing a silicon oxide film 73 over the individual bit lines $BL_1$ and $BL_2$ and wiring lines 70A and 70B by the plasma CVD method, by subsequently polishing the silicon oxide film 73 to give it a flat surface by the chemino-mechanical polishing (CMP) method, and then by etching the silicon oxide film 73 by using a photoresist as the mask. At this time, the silicon nitride film 71 formed over the bit line $BL_1$, and the side wall spacers 72 of silicon nitride formed on the side walls are slightly etched, so that the connection holes 74 are formed in a self-alignment manner.

The insulating film deposited over the bit lines $BL_1$ and $BL_2$ and the wiring lines 70A and 70B can be exemplified by not only the aforementioned silicon oxide film 73, but also by the aforementioned ozone-BPSG film or ozone-TEOS film, or a spin-on-glass (SOG) film. When the ozone-BPSG film or the ozone-TEOS film is used, it is polished to flatten the surface by the chemino-mechanical polishing (CMP) method similarly to the polishment of the silicon oxide film 73.

Figure 33:
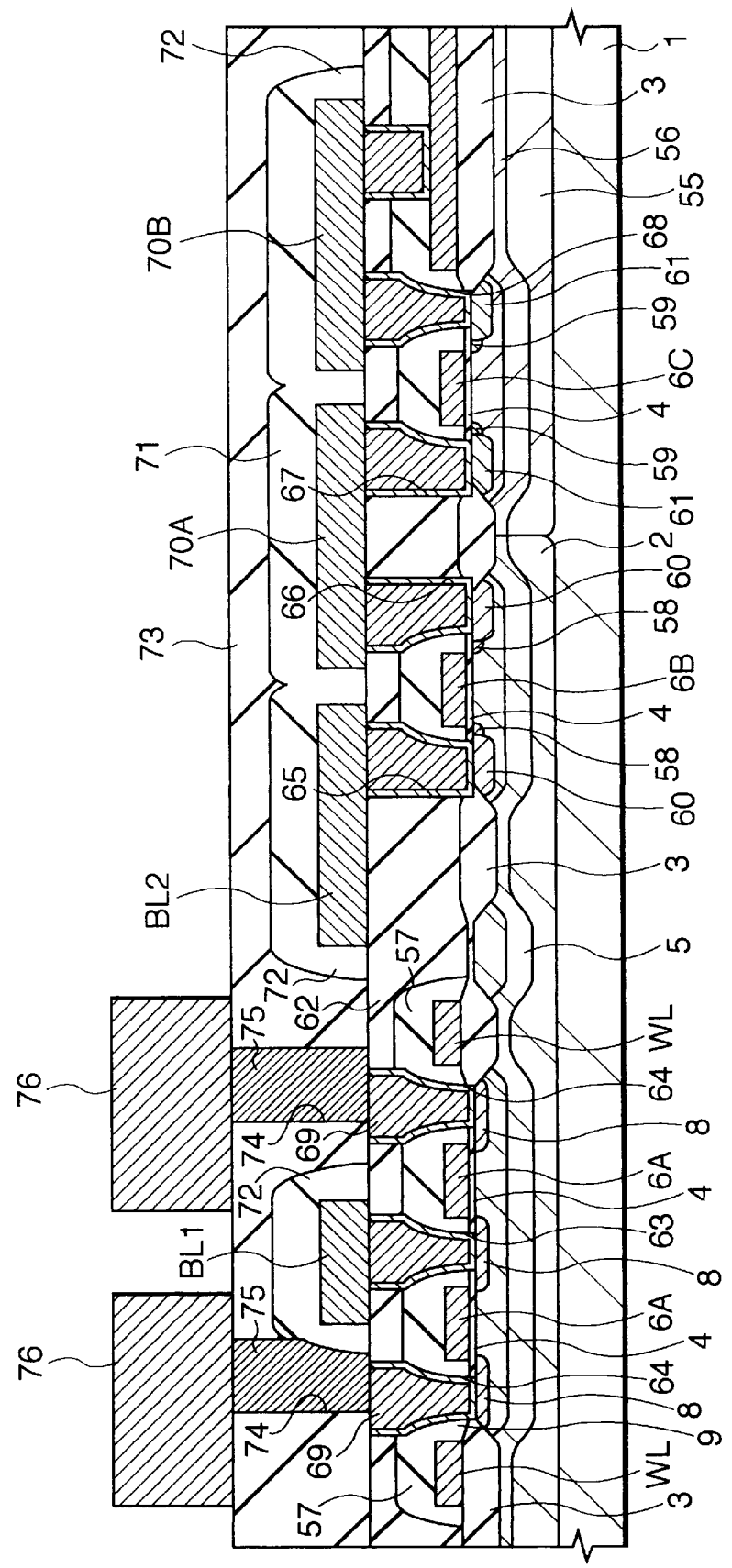
FIG. 33 is a sectional diagram of the essential portion of the semiconductor substrate, showing a step of the method of manufacturing the DRAM of the embodiment according to the present invention.

Next, plugs 75 of W are buried in the connection holes 74, as shown in FIG. 33, and lower electrodes (storage electrodes) 76 of the data storing capacitive element are then formed over the connection holes 74. The W plugs 75 are formed by depositing a W film over the silicon oxide film 73 by the CVD method and then by etching back the W film. The lower electrodes 76 are formed by depositing the W film over the silicon oxide film 73 by the CVD method and then by patterning the W film by the etching method using a photoresist as the mask.

Figure 34:
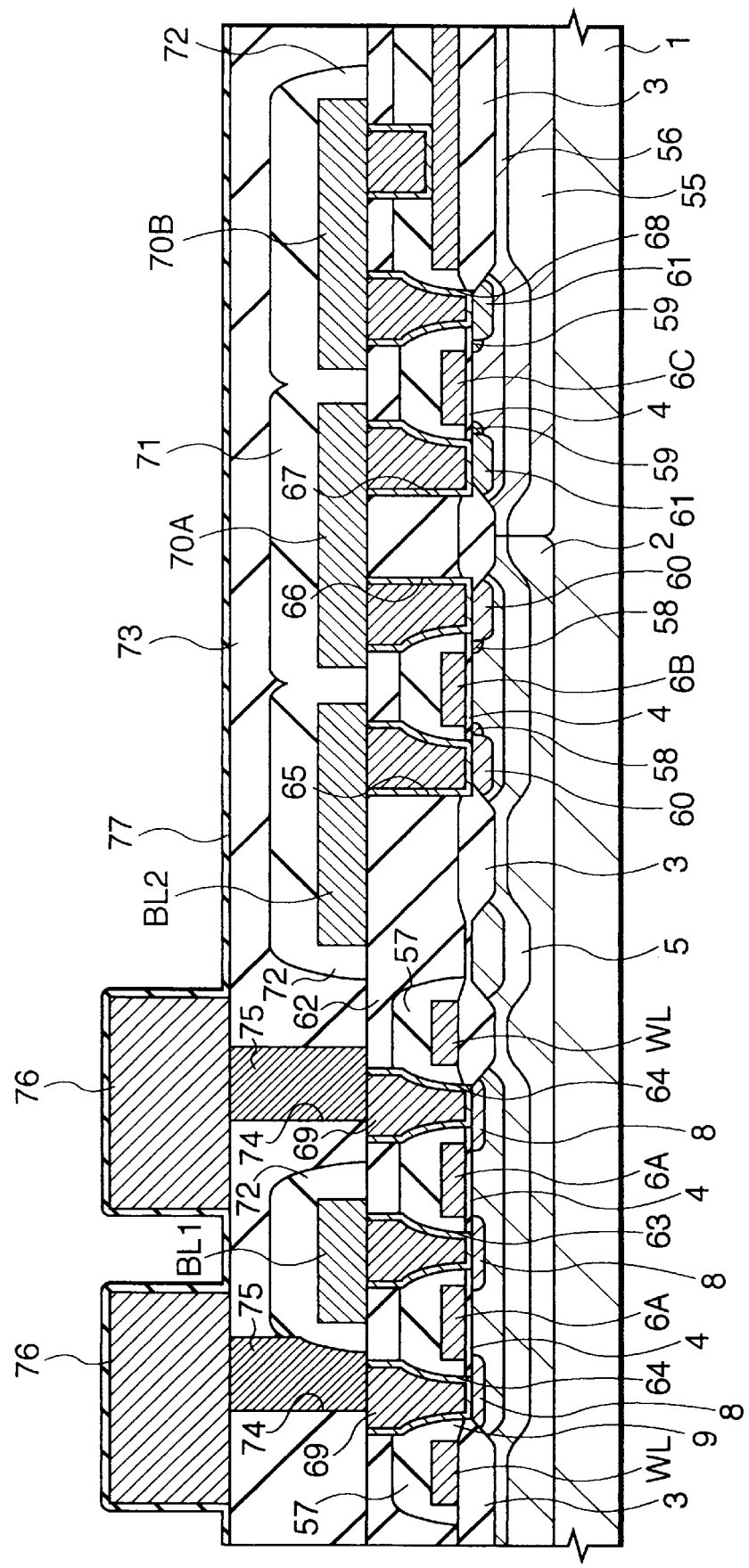
FIG. 34 is a sectional diagram of the essential portion of the semiconductor substrate, showing a step of the method of manufacturing the DRAM of the embodiment according to the present invention.

Next, a tantalum oxide film 77 is deposited over the lower electrode 22, as shown in FIG. 34. The tantalum oxide film 77 is deposited by using the CVD method of an excellent step coverage. The tantalum oxide 77 is deposited at a temperature of about 400° C. by using, for example, $TA(OC_2H_5)$ as the reaction gas and is then annealed at a temperature of about 700 to 1,000° C. by using an electric furnace or a lamp annealing apparatus.

Next, a conductive film for the upper electrodes is deposited over the tantalum oxide film 77 by using the CVD apparatus, as used in the foregoing first embodiment 1. The titanium-containing source gas used at this time is exemplified by $TiCl_4$, TDMAT or TDEAT; the nitrogen-containing reducing gas is exemplified by $NH_3$ or MMH, or their mixed gas; and the inert gas is exemplified by He, Ar or $N_2$, or their mixed gas.

Figure 35:
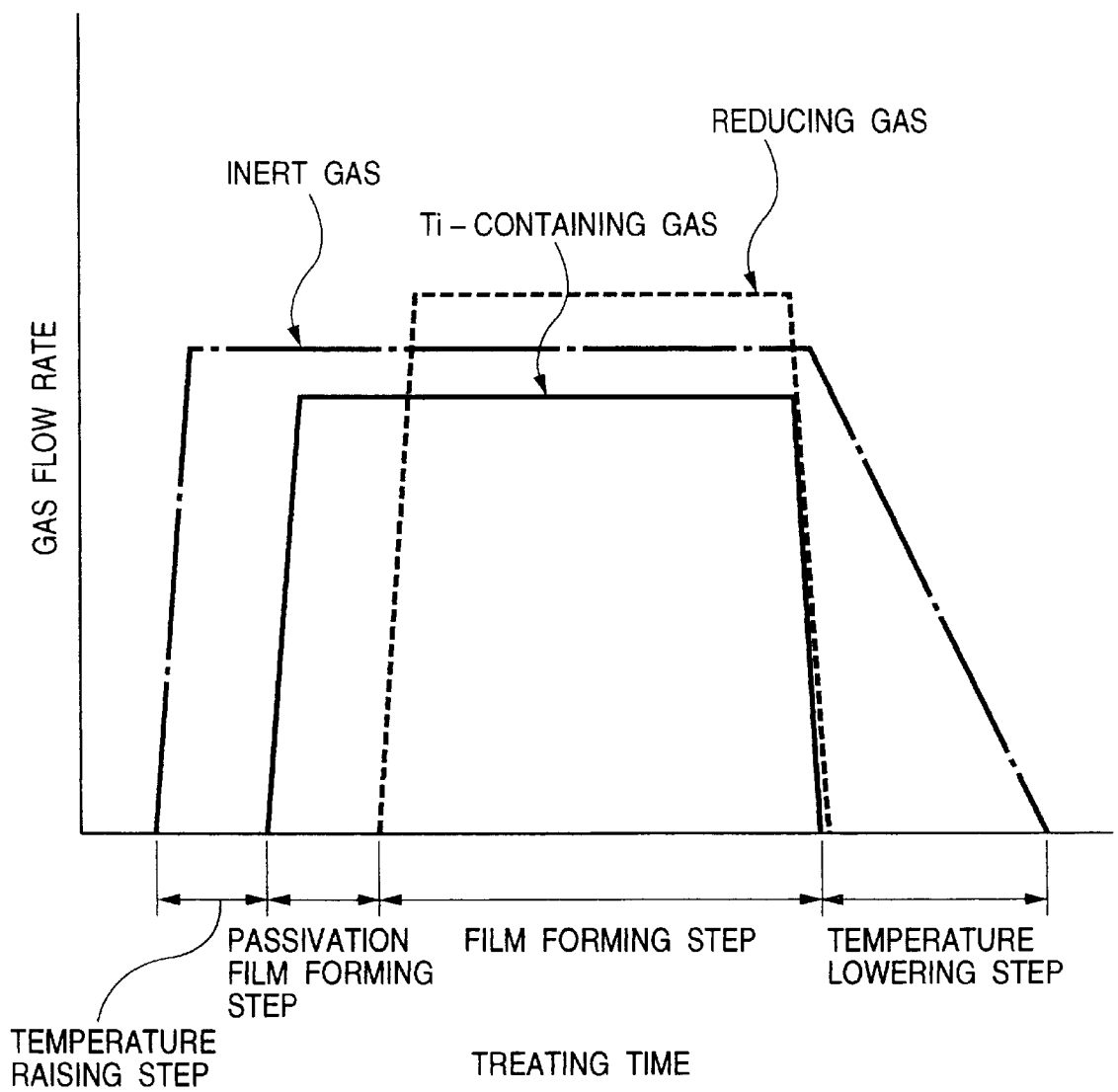
FIG. 35 is a graph illustrating the step of forming a TiN film for an upper electrode.
Figure 36:
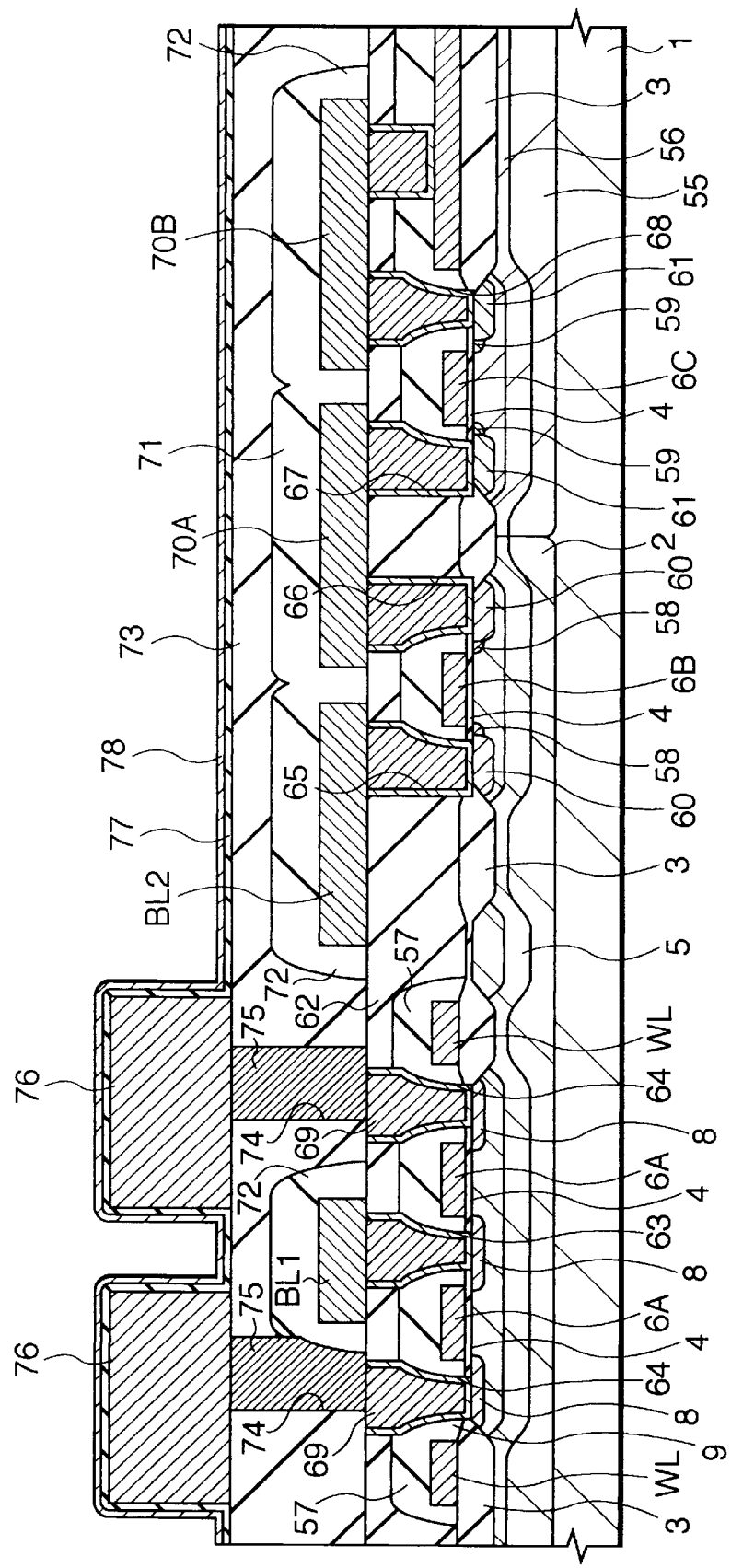
FIG. 36 is a sectional diagram of an essential portion of a semiconductor substrate, showing a step of a method of manufacturing a DRAM of another embodiment according to the present invention.
Figure 37:
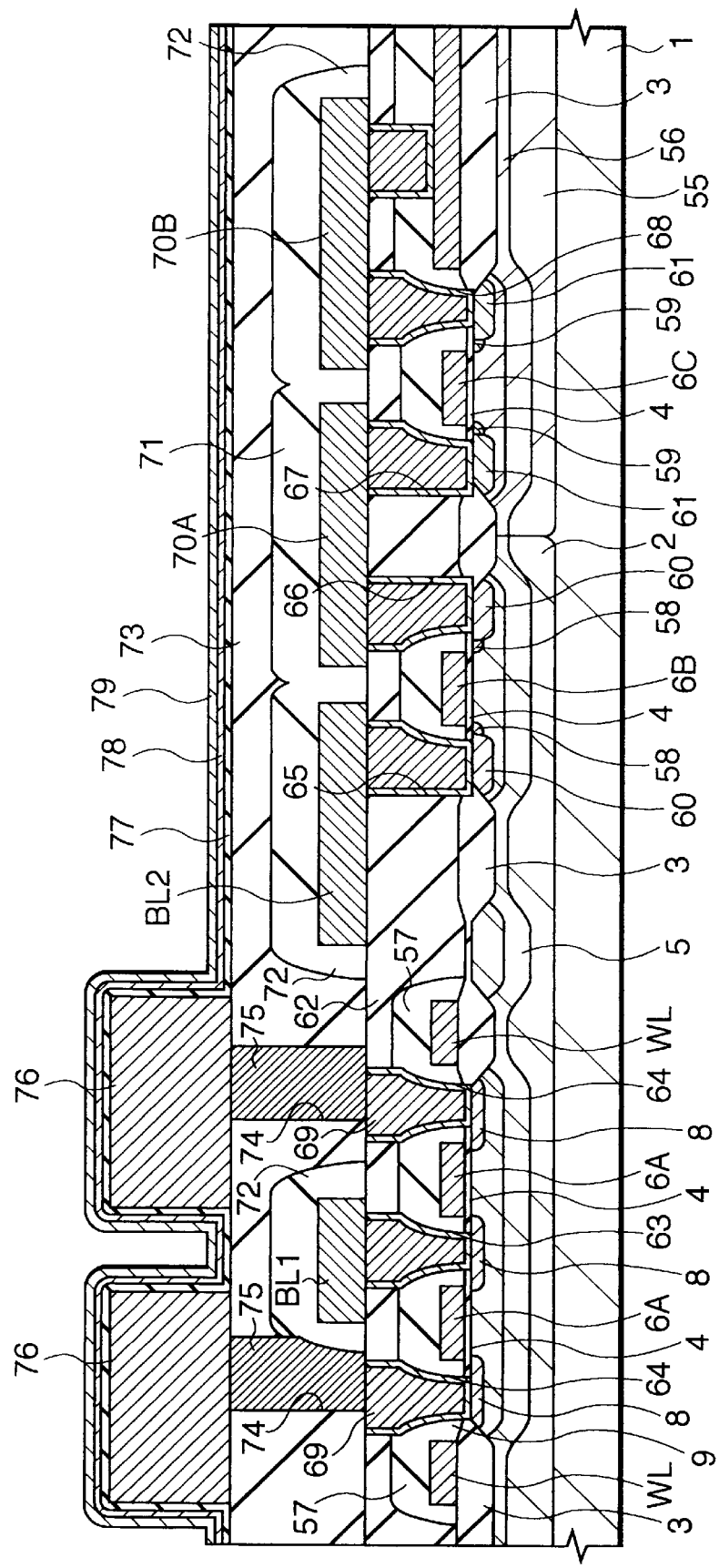
FIG. 37 is a sectional diagram of the essential portion of the semiconductor substrate, showing a step of the method of manufacturing the DRAM of the embodiment according to the present invention.

In the present embodiment, the gases are introduced into the chamber of the CVD apparatus in accordance with the steps, as illustrated in FIG. 35. Specifically, the chamber is evacuated to a predetermined degree of vacuum, and the inert gas is then introduced while raising the temperature of the substrate. When the substrate temperature becomes substantially constant, the titanium-containing source gas is introduced and thermally decomposed to form a passivation film 78 made mainly of Ti and having a thickness as small as about 30 to 50 angstroms, over the surface of the tantalum oxide film 77, as shown in FIG. 36. Subsequently, the nitrogen-containing reducing gas is introduced into the chamber and reacted with the titanium-containing gas thereby to deposit a TiN film 79 over the surface of the passivation film 78, as shown in FIG. 37. Representative reactions at this time between the titanium-containing source gas and the nitrogen-containing reducing gas are shown in FIG. 38.

Figure 39:
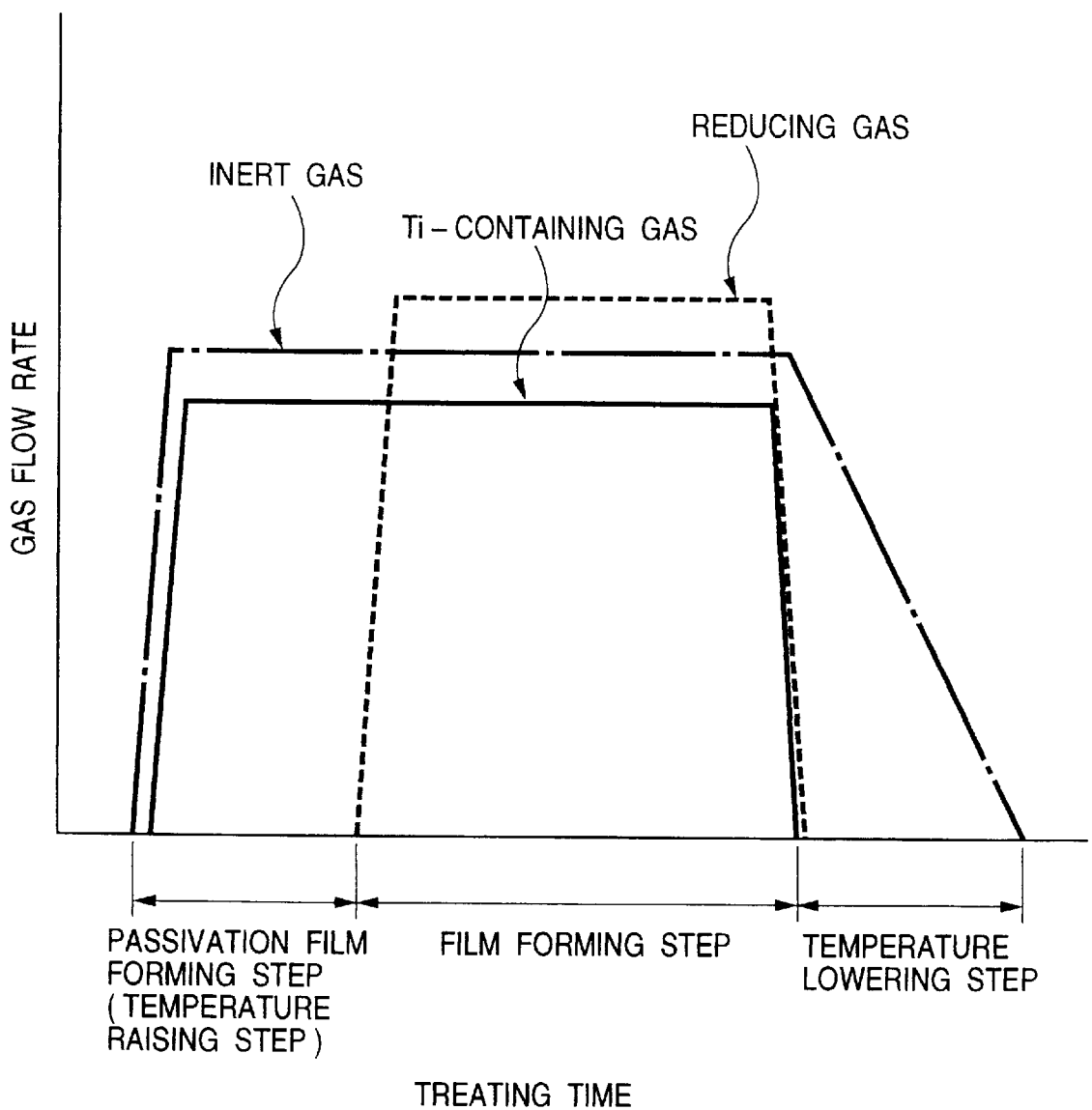
FIG. 39 is a graph illustrating the step of forming a TiN film for an upper electrode.
Figure 40:
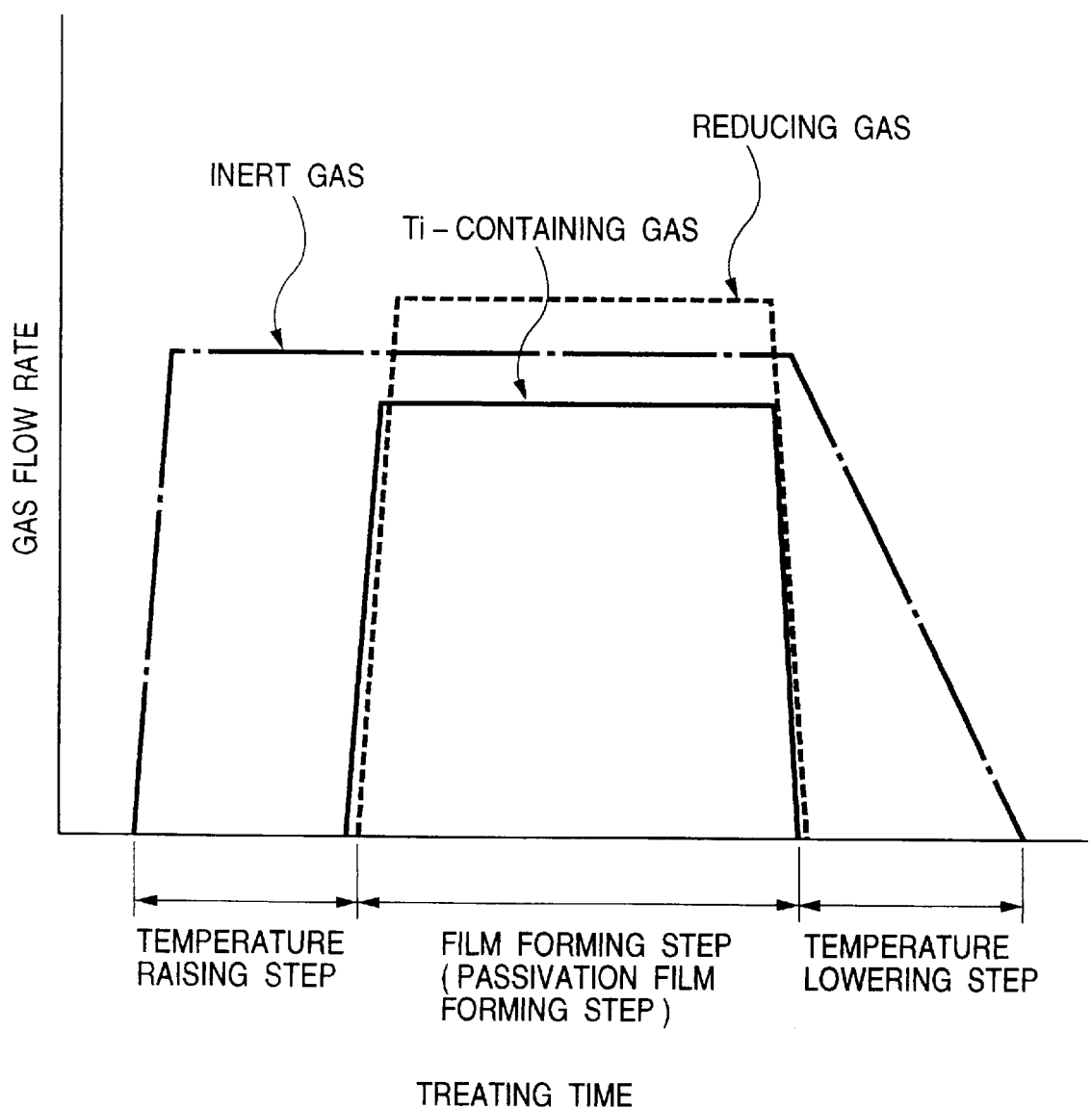
FIG. 40 is a graph illustrating the step of forming a TiN film for an upper electrode.

The titanium-containing source gas may be introduced substantially simultaneously with the inert gas while the temperature of the substrate is raised, as shown in FIG. 39, or just before the introduction of the nitrogen-containing reducing gas, as shown FIG. 40. In either case, however, the titanium-containing source gas is introduced prior to the introduction of the nitrogen-containing reducing gas. Then, the passivation film 78 is formed on the surface of the tantalum oxide film 77 by the thermal decomposition of the titanium-containing source gas, and prevents the contact between the nitrogen-containing reducing gas to be later introduced and the tantalum oxide film 77 thereby to prevent the deterioration of the tantalum oxide film 77.

Then, the passivation film 78 and the TiN film 79 are deposited over the tantalum oxide film 77, under such a film forming temperature condition that the barrier of the passivation film 78 against the permeation of the nitrogen-containing reducing gas is sufficiently high. Specifically, the film forming step is executed at a temperature lower than the crystallization temperature to form the amorphous or polycrystalline passivation film 78 which has less paths therein through which gas permeates than a crystalline film.

The optimum temperature at which the passivation film 78 and the TiN film 79 are formed is different depending upon the kind of the titanium-containing source gas and the nitrogen-containing reducing gas to be used and their combination but is generally 550° C. or less when the nitrogen-containing reducing gas is exemplified by $NH_3$, preferably 500° C. or less, and more preferably 450° C. or less when the MMH is used.

Figure 41:
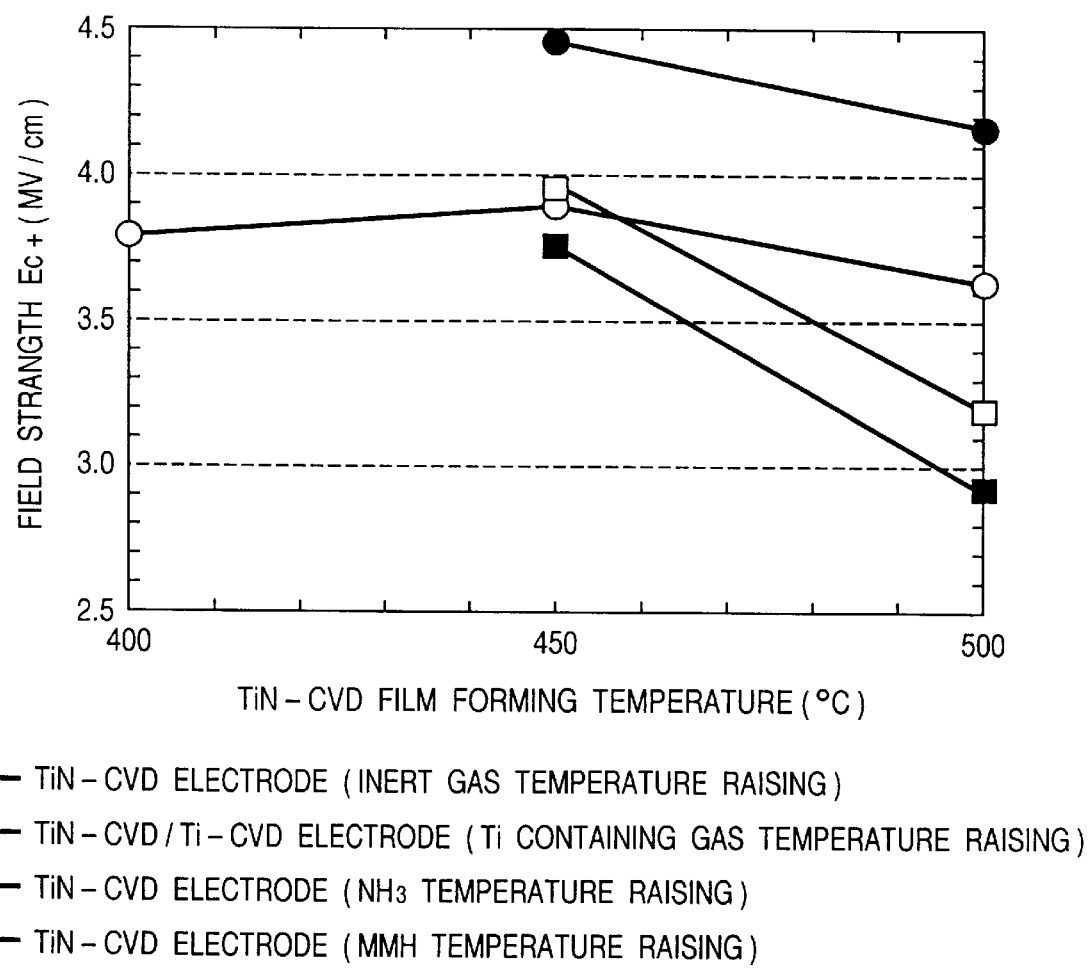
FIG. 41 is a graph illustrating the relations between the temperatures at which the passivation film and the TiN film are formed and the field strength of a tantalum oxide film.
Figure 42:
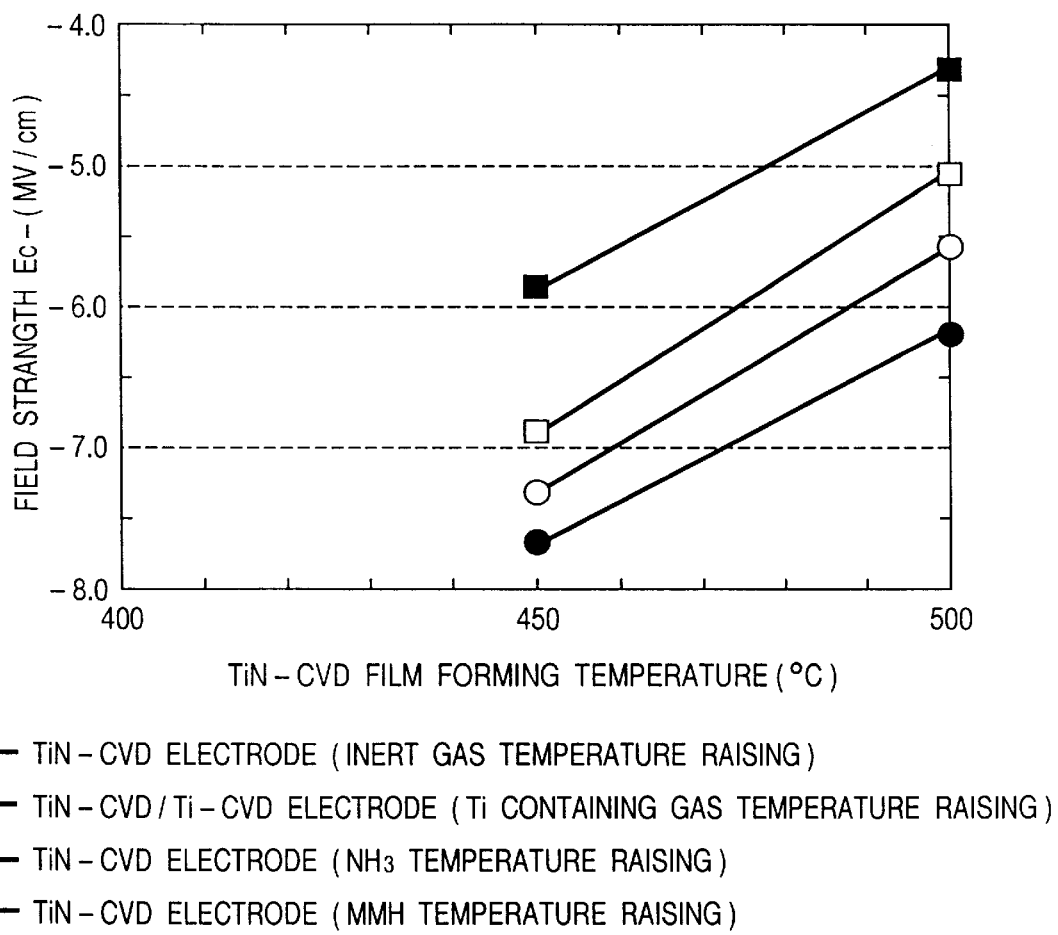
FIG. 42 is a graph illustrating the relations between the temperatures at which the passivation film and the TiN film are formed and the field strength of a tantalum oxide film.

FIGS. 41 and 42 are graphs showing the results of an experiment, in which the relation between the film forming temperatures of the passivation film 78 and the TiN film 79 and the field strength of the tantalum oxide film 77 are shown. FIG. 41 shows the field strength of $10^{-8}$ A/cm$^2$ when the positive (+) voltage is applied to the upper electrode made of the TiN film 79, and FIG. 42 shows the field strength of $10^{-8}$ A/cm$^2$ when the negative (−) voltage is applied to the same upper electrode. In the drawings: open circles (◯) indicate the field strength when the films are formed at the steps shown in FIG. 35 (the inert gas=He+Ar, the titanium-containing source gas=TiCl$_4$, and the nitrogen-containing reducing gas=NH$_3$); solid circles (●) indicate the field strength when the films are formed at the steps shown in FIG. 39 (the inert gas=He+Ar, the titanium-containing source gas=TiCl$_4$, and the nitrogen-containing reducing gas=NH$_3$); open squares (□) indicate the field strength when the films are formed at the steps shown in FIG. 40 (the inert gas=He+Ar, the titanium-containing source gas=TiCl$_4$, and the nitrogen-containing reducing gas=NH$_3$); and solid squares (■) indicate the field strength when the films are formed at the steps shown in FIG. 40 (the inert gas=He+Ar, the titanium-containing source gas=TiCl$_4$, and the nitrogen-containing reducing gas=NH$_3$+MMH).

Figure 43:
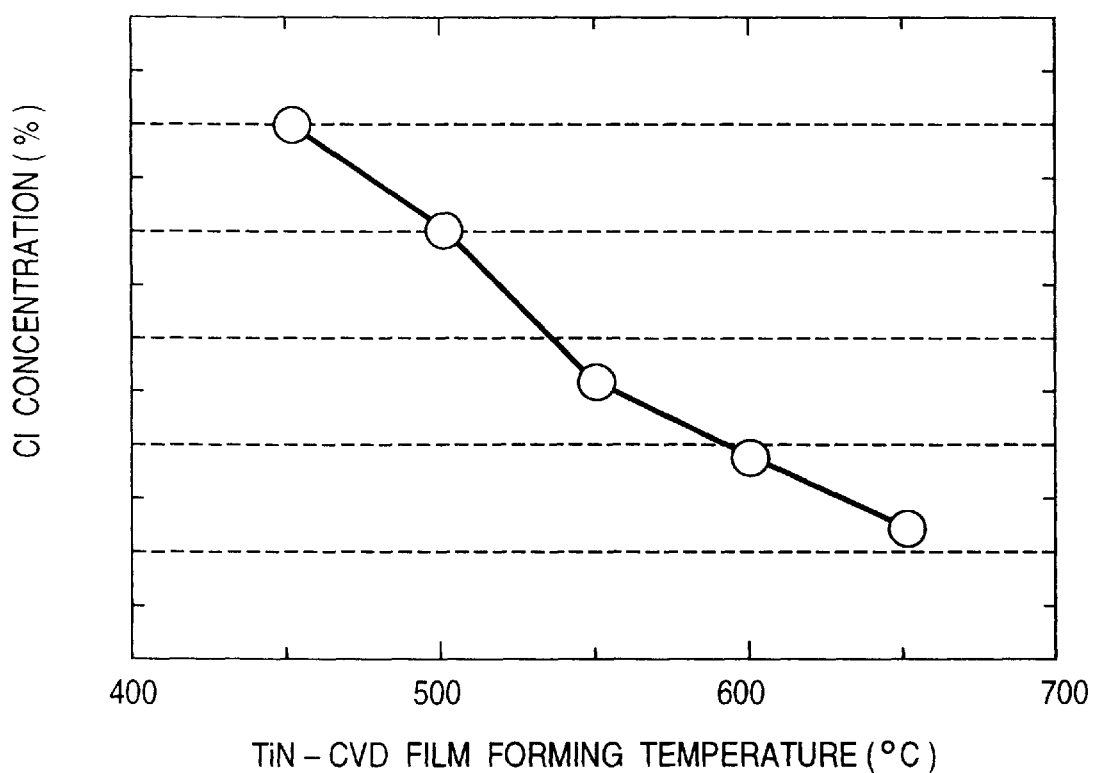
FIG. 43 is a graph illustrating the relations between the temperatures at which the passivation film and the TiN film are formed and the concentration of chloride introduced into the films.

It has been found from the aforementioned results of experiment that the field strength of the tantalum oxide film 77 generally increases and the leakage breakdown voltage of the capacitor insulating film is improved when the film forming temperature of the passivation film 78 and the TiN film 79 are low. Incidentally, in the aforementioned film forming process, chlorine produced by the decomposition of the titanium-containing source gas (TiCl$_4$) is included in the films. This chlorine concentration increases as the film forming temperature lowers, as shown in FIG. 43. If chlorine of high concentration is captured in the conductive film constituting the upper electrode, the chlorine atoms further enter the wiring lines containing Al (aluminum) through the connection holes connecting the upper electrode and the wiring lines when the wiring lines are formed over the upper electrode, so that the potential causing the wiring corrosion rises. Therefore, the lower limit of the film forming temperature of the passivation film 78 and the TiN film 79 has to be determined considering the rise in the potential.

Figure 44:
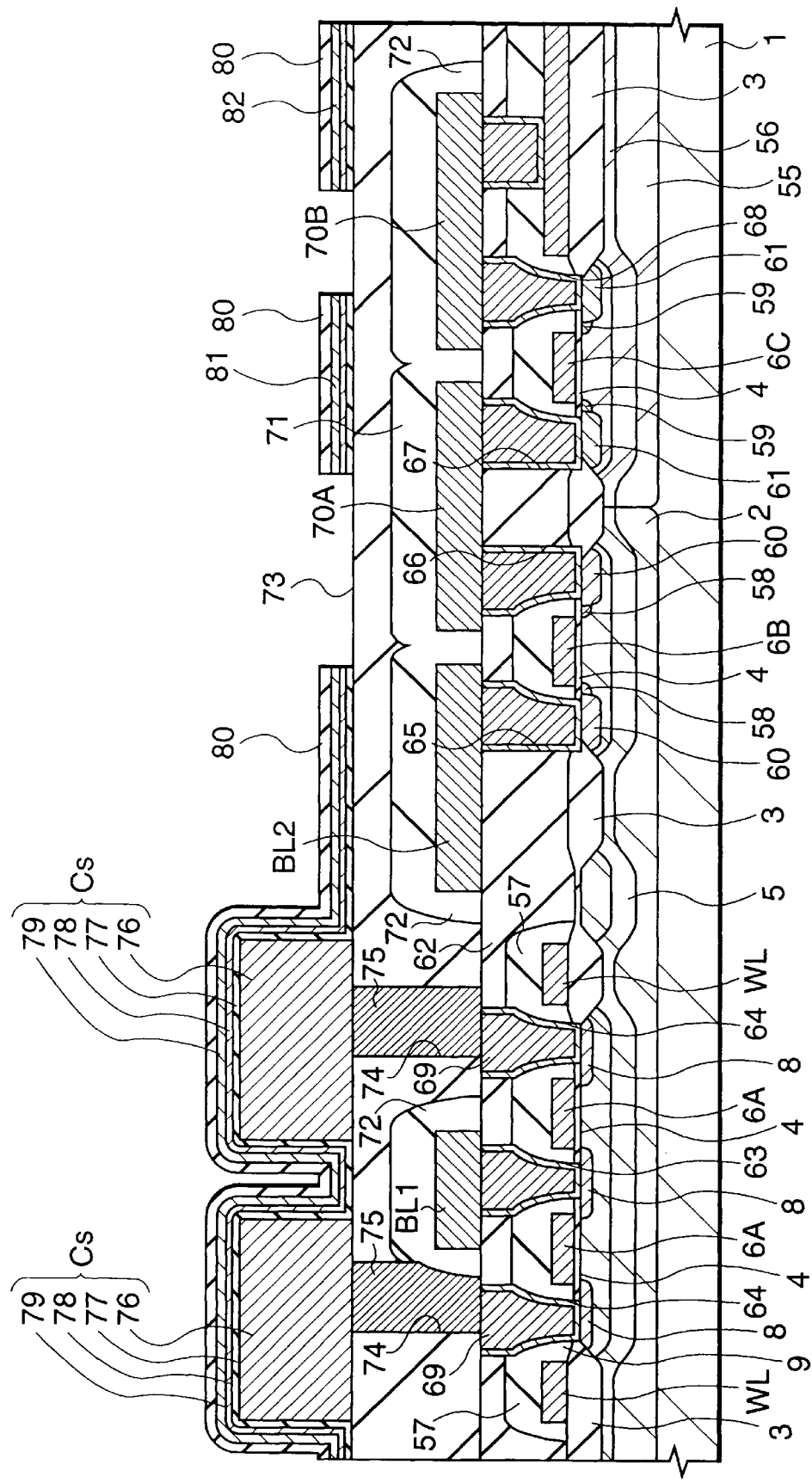
FIG. 44 is a sectional diagram of an essential portion of a semiconductor substrate, showing a step of a method of manufacturing a DRAM of another embodiment according to the present invention.

Next, a high selection ratio film 80 is deposited over the TiN film 79, as shown in FIG. 44. After this, the high selection ratio film 80, the TiN film 79, the passivation film 78 and the tantalum oxide film 77 are patterned by the dry etching method using a photoresist as the mask, to form an upper electrode (plate electrode) 90 and the capacitor insulating film (the tantalum oxide film 77) thereby to complete the data storing capacitive element Cs. Simultaneously with this, there are further formed wiring lines 81 and 82 of the peripheral circuit. The high selection ratio film 80 is a film acting as the etching stopper when the silicon oxide film and the silicon nitride film are etched at the later steps and may be either an insulating film or a conductive film if it is made of a material having a high etching selection ratio of the silicon oxide film or the silicon nitride film.

Figure 45:
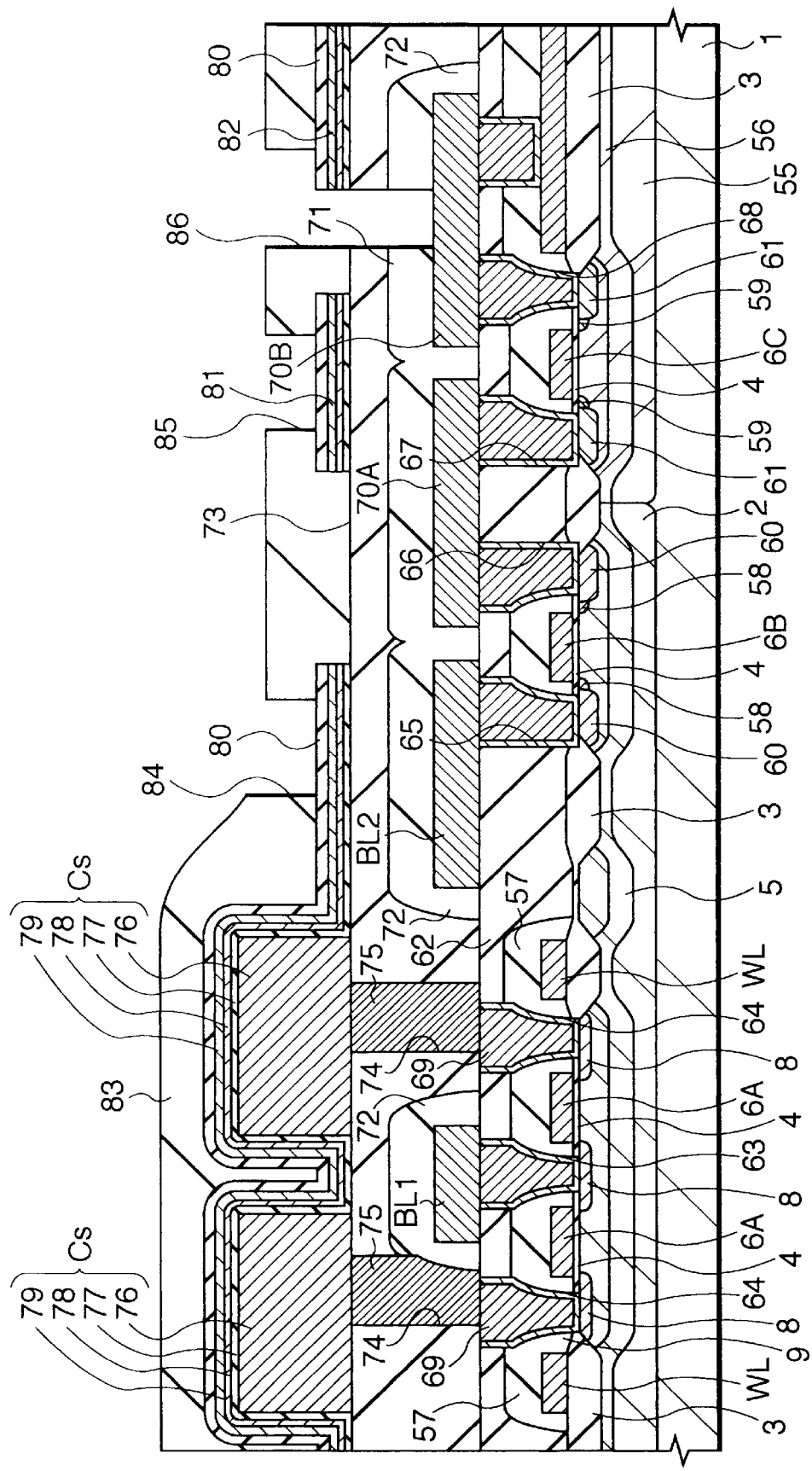
FIG. 45 is a sectional diagram of the essential portion of the semiconductor substrate, showing a step of the method of manufacturing the DRAM of the embodiment according to the present invention.

Next, a silicon oxide film 83 is deposited over the data storing capacitive element Cs and the wiring lines 81 and 82, as shown in FIG. 45. After this, the silicon oxide film 83 is dry-etched by using a photoresist as the mask to form a connection hole 84 over the upper electrode 90 of the data storing capacitive element Cs and a connection hole 85 over the wiring line 81. Simultaneously with this, the silicon oxide film 83, in the region where the wiring line 82 is formed, the silicon oxide film 73 and the silicon nitride film 71 are etched to form a connection hole 86 over the wiring line 70B of the peripheral circuit. At this time, the upper electrode 90 and the wiring lines 81 and 82 are covered with the high selection ratio film 80, so that they are not etched and thinned.

Figure 46:
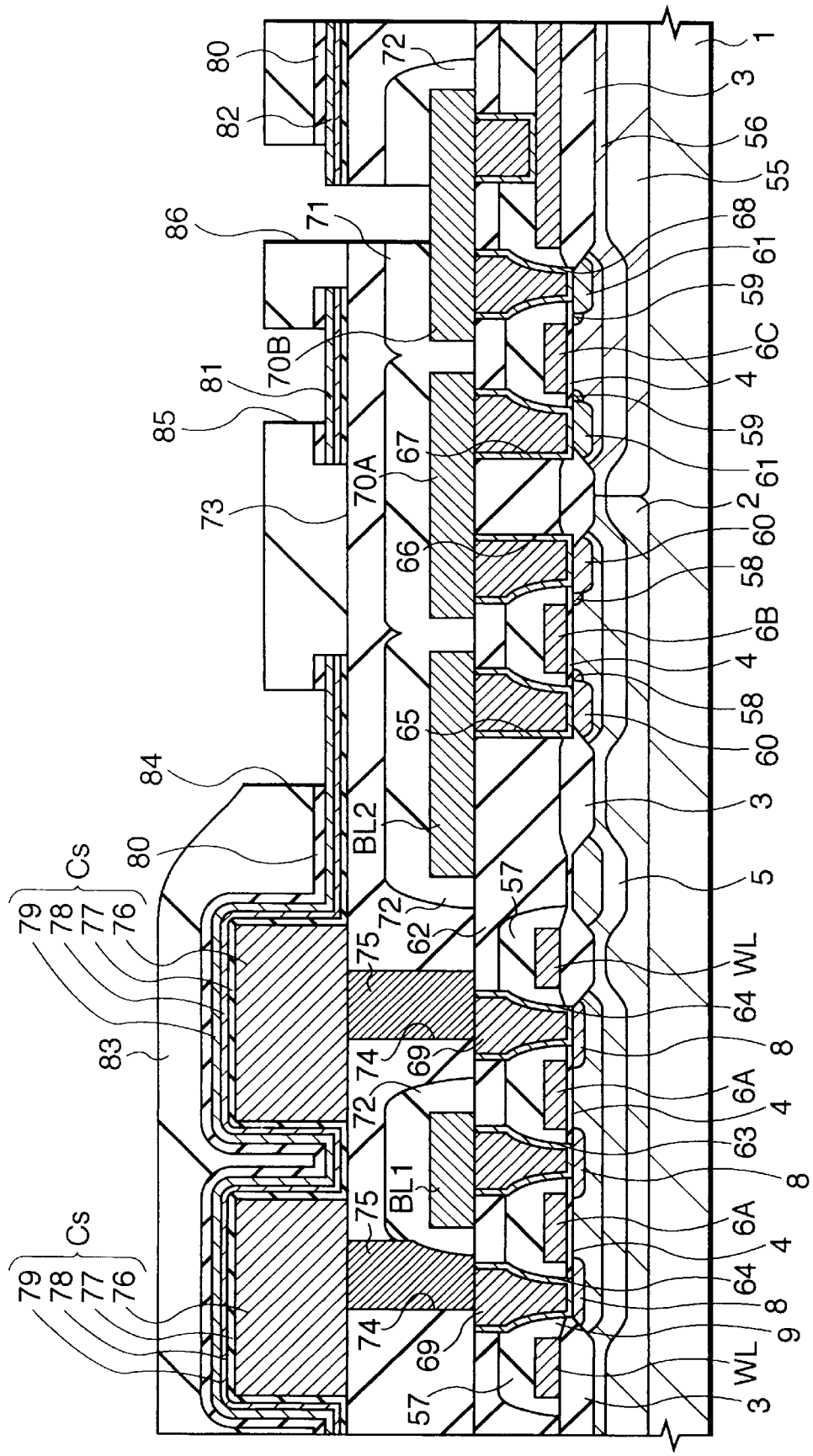
FIG. 46 is a sectional diagram of the essential portion of the semiconductor substrate, showing a step of the method of manufacturing the DRAM of the embodiment according to the present invention.

Next, the high selection ratio film 80, covering the upper electrode 90 and the wiring lines 81 and 82, is etched, as shown in FIG. 46, to expose a portion of the wiring line 81 in the connection hole 85 and one end of the wiring line 82 in the connection hole 86.

Figure 47:
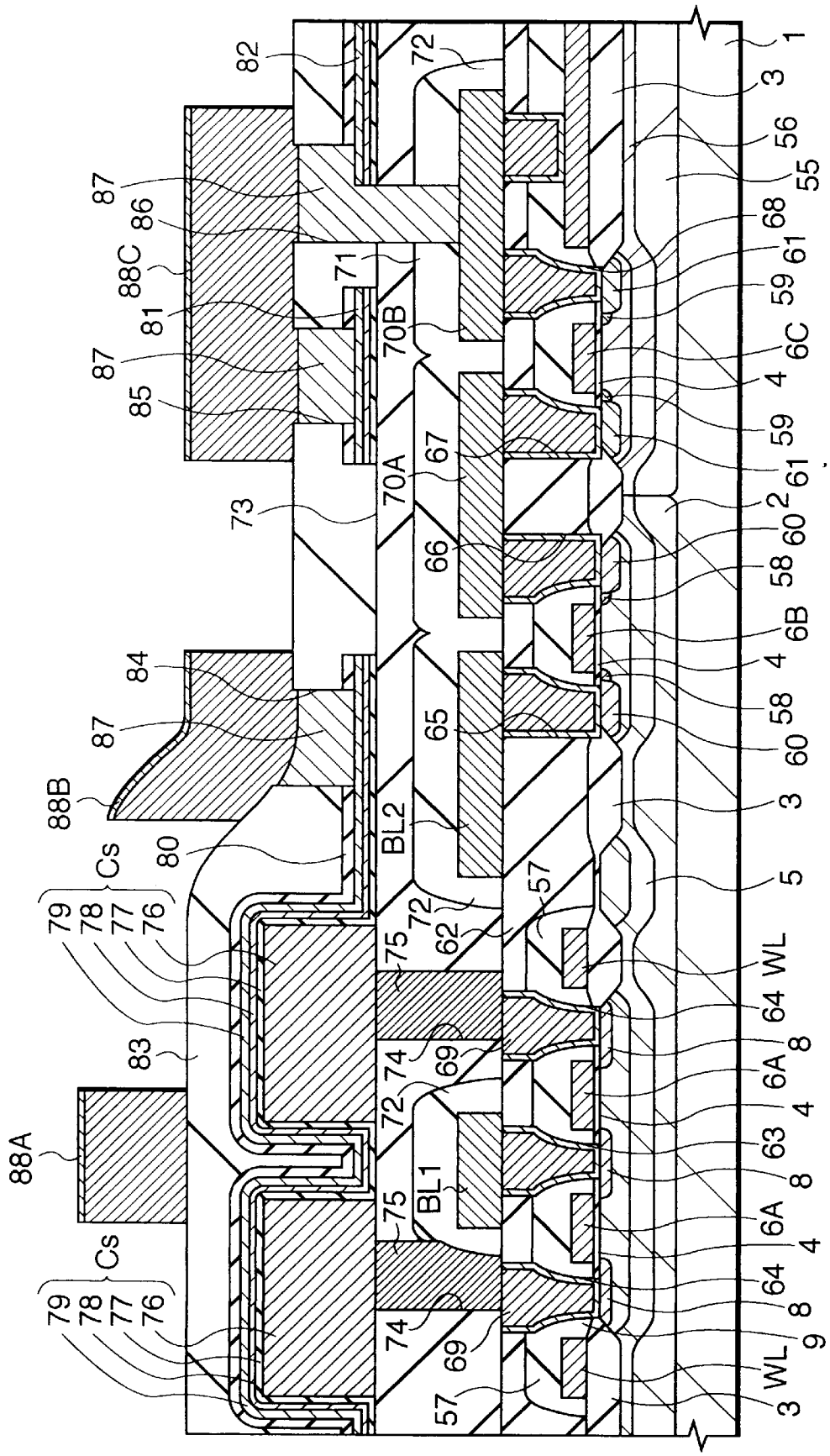
FIG. 47 is a sectional diagram of the essential portion of the semiconductor substrate, showing a step of the method of manufacturing the DRAM of the embodiment according to the present invention.

Next, plugs 87 of TiN (or W) are buried in the connection holes 84, 85 and 86, as shown in FIG. 47. After this, wiring lines 88A, 88B and 88C, made of a multilayer film of Al and TiN, are formed over the silicon oxide film 83. As a result, the wiring line 81 of the peripheral circuit is connected through the wiring lines 88C and 82 with the underlying wiring line 70B.

Thus, according to the present embodiment, when the TiN film 79 is deposited by the low temperature CVD method over the tantalum oxide film 77 constituting the capacitor insulating film of the data storing capacitive element Cs to form the upper electrode 90, the passivation film 78, which is impermeable to the nitrogen-containing reducing gas, is formed in advance over the surface of the tantalum oxide film 73, so that the degradation of the breakdown voltage (the increase in the leakage current) of the tantalum oxide film 77 can be prevented reliably. As a result, it is possible to realize a DRAM which improved refreshing characteristics.

Although our invention has been specifically described in connection with various exemplary embodiments, it should not be limited thereto, but can naturally be modified in various manners without departing from the gist thereof.

The foregoing embodiments have been described for cases where the upper electrode of the capacitive element is made of TiN, but the present invention can also be applied to a semiconductor integrated circuit device in which the upper electrode is made of a material other than TiN, for example TaN. When a TaN film is deposited over the tantalum oxide film by the CVD method, for example, there is used a method in which Ta(OC$_2$H$_5$) is reduced with a nitrogen-containing reducing gas such as NH$_3$ or MMH. By forming the passivation film over the surface of the tantalum oxide film prior to the formation of the TaN film, therefore, it is possible to prevent the degradation of the breakdown voltage of the tantalum oxide film which may be caused by the contact with the nitrogen-containing reducing gas.

The present invention can also be applied to the DRAM or nonvolatile memory in which the capacitor insulating film of the capacitive element is made of a highly dielectric film or a ferroelectric film other than tantalum oxide, such as BaSrTiO$_3$, SrTiO$_3$, BaTiO$_3$ or PZT, or ZnO doped with B (boron) or F (fluorine).

The effects obtained by a representative one of the features disclosed herein will be briefly described in the following.

According to the present invention, when a TiN film is deposited over the tantalum oxide film constituting the capacitor insulating film of the capacitive element to form the upper electrode, a passivation film is formed in advance over the surface of the tantalum oxide film, so that contact between the nitrogen-containing reducing gas and the tantalum oxide film can be prevented, making it possible to form a capacitive element having improved breakdown voltage characteristics.

According to the present invention, the accumulated charge of the capacitive element can be increased by constructing the capacitor insulating film of the capacitive element of a film having a high dielectric constant.

What is claimed is:

1. A method for manufacturing a semiconductor integrated circuit device, comprising the steps of:

(a) forming a capacitor insulating film of tantalum oxide over a lower electrode over a first major surface of a semiconductor substrate;

(b) annealing the capacitor insulating film at a first temperature; and then (c) depositing an upper electrode of titanium nitride over the capacitor insulating film at a second temperature lower than the first temperature, wherein the step (c) comprises substeps of:

(i) introducing a titanium-containing source gas into a reaction chamber where the semiconductor substrate has been introduced; and (ii) subsequent to substep (i), introducing a nitrogen-containing reducing gas into the reaction chamber, while introducing the titanium-containing source gas into the reaction chamber, thereby depositing a titanium nitride film constituting the upper electrode.

2. A method for manufacturing a semiconductor integrated circuit device according to claim 1, wherein the deposition of the upper electrode is carried out by a chemical vapor deposition.

3. A method for manufacturing a semiconductor integrated circuit device according to claim 2, wherein step (c) further comprises the substep of:

(iii) prior to substep (i), introducing an inert gas into the reaction chamber where the semiconductor substrate has been introduced.

4. A method for manufacturing a semiconductor integrated circuit device according to claim 3, wherein step (c) further comprises the substep of:

(iv) after substep (ii), introducing an inert gas into the reaction chamber where the semiconductor substrate has been introduced, without introducing the nitrogen-containing reducing gas or the titanium-containing source gas.

5. A method for manufacturing a semiconductor integrated circuit device according to claim 4, wherein the inert gas is selected from the group consisting of nitrogen, helium, argon and mixtures thereof.

6. A method for manufacturing a semiconductor integrated circuit device according to claim 5, wherein the lower electrode has a cylindrical portion and constitutes a memory capacitor together with the capacitor insulating film and the upper electrode.

7. A method for manufacturing a semiconductor integrated circuit device, comprising the steps of:

(a) forming a capacitor insulating film of tantalum oxide over a lower electrode over a first major surface of a semiconductor substrate;

(b) annealing the capacitor insulating film at a first temperature; and then (c) depositing an upper electrode of titanium nitride over the capacitor insulating film at a second temperature lower than the first temperature, wherein the step (c) comprises substeps of:

(i) introducing an inert gas into a reaction chamber where the semiconductor substrate has been introduced; and (ii) subsequent to substep (i), introducing a nitrogen-containing reducing gas and a titanium-containing source gas into the reaction chamber, thereby depositing a titanium nitride film constituting the upper electrode.

8. A method for manufacturing a semiconductor integrated circuit device according to claim 7, wherein the deposition of the upper electrode is carried out by a chemical vapor deposition.

9. A method for manufacturing a semiconductor integrated circuit device according to claim 8, wherein the inert gas is selected from the group consisting of nitrogen, helium, argon, and mixtures thereof.

10. A method for manufacturing a semiconductor integrated circuit device according to claim 9, wherein the lower electrode has a cylindrical portion and constitutes a memory capacitor together with the capacitor insulating film and the upper electrode.

11. A method for manufacturing a semiconductor integrated circuit device, comprising the steps of:

(a) depositing a capacitor insulating film of tantalum oxide over a lower electrode over a first major surface of a semiconductor substrate by a chemical vapor deposition at a first temperature;

(b) annealing the capacitor insulating film at a second temperature higher than the first temperature; and then (c) depositing an upper electrode of titanium nitride over the capacitor insulating film by a chemical vapor deposition at a third temperature lower than 600° C.

12. A method for manufacturing a semiconductor integrated circuit device according to claim 11, wherein the lower electrode has a cylindrical portion and constitutes a memory capacitor together with the capacitor insulating film and the upper electrode.

13. A method for manufacturing a semiconductor integrated circuit device according to claim 12, wherein the third temperature is not higher than 550° C.

14. A method for manufacturing a semiconductor integrated circuit device, comprising the steps of:

(a) forming a capacitor insulating film of tantalum oxide over a lower electrode over a first major surface of a semiconductor substrate;

(b) annealing the capacitor insulating film at a first temperature; and then (c) depositing an upper electrode of titanium nitride over the capacitor insulating film at a second temperature lower than the first temperature, wherein the step (c) comprises the substeps of:

(i) introducing a nitrogen-containing reducing gas and a titanium-containing source gas into a reaction chamber where the semiconductor substrate has been introduced, thereby depositing a titanium nitride film constituting the upper electrode; and then (ii) introducing an inert gas into the reaction chamber where the semiconductor substrate has been introduced, without introducing the nitrogen-containing reducing gas or the titanium-containing source gas.

15. A method for manufacturing a semiconductor integrated circuit device according to claim 14, wherein the deposition of the upper electrode is carried out by a chemical vapor deposition.

16. A method for manufacturing a semiconductor integrated circuit device according to claim 15, wherein step (c) further comprises the substep of:

(iii) prior to substep (i), introducing an inert gas into the reaction chamber where the semiconductor substrate has been introduced.

17. A method for manufacturing a semiconductor integrated circuit device according to claim 16, wherein the inert gas is selected from the group consisting of nitrogen, helium, argon, and mixtures thereof.

18. A method for manufacturing a semiconductor integrated circuit device according to claim 1, wherein said lower electrode is cylindrical, having inner and outer surfaces, and wherein said forming the capacitor insulating film forms the capacitor insulating film on both the inner and outer surfaces of the lower electrode.

* * * * *